(12) United States Patent
Quinones et al.

(10) Patent No.: US 12,087,677 B2
(45) Date of Patent: Sep. 10, 2024

(54) MOLDED PACKAGING FOR WIDE BAND GAP SEMICONDUCTOR DEVICES

(71) Applicant: SEMICONDUCTOR COMPONENTS INDUSTRIES, LLC, Phoenix, AZ (US)

(72) Inventors: Maria Clemens Ypil Quinones, Cebu City (PH); Bigildis Dosdos, San Jose, CA (US); Jerome Teysseyre, Scottsdale, AZ (US); Erwin Ian Vamenta Almagro, Lapu-Lapu City (PH); Romel N Manatad, Liloan (PH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 257 days.

(21) Appl. No.: 17/248,382

(22) Filed: Jan. 22, 2021

(65) Prior Publication Data
US 2022/0238421 A1    Jul. 28, 2022

(51) Int. Cl.
*H01L 23/495* (2006.01)
*H01L 21/48* (2006.01)
(Continued)

(52) U.S. Cl.
CPC .... *H01L 23/49562* (2013.01); *H01L 21/4825* (2013.01); *H01L 21/4828* (2013.01);
(Continued)

(58) Field of Classification Search
CPC ............. H01L 21/4828; H01L 21/4882; H01L 23/3142; H01L 23/4824; H01L 23/4951;
(Continued)

(56) References Cited

U.S. PATENT DOCUMENTS 7,705,476 B2    4/2010  Bayan et al.
2005/0130350 A1 6/2005  Estacio et al.
(Continued)

FOREIGN PATENT DOCUMENTS

TW        200522295 A  *  7/2005  ......... H01L 23/3107

OTHER PUBLICATIONS

Machine English transation of TW-200522295-A (Year: 2005).*
(Continued)

*Primary Examiner* — Yu Chen
(74) *Attorney, Agent, or Firm* — Brake Hughes Bellermann LLP

(57) ABSTRACT

A semiconductor device package may include a leadframe having a first portion with first extended portions and a second portion with second extended portions. Mold material may encapsulate a portion of the leadframe and a portion of a semiconductor die mounted to the leadframe. A first set of contacts of the semiconductor die may be connected to a first surface of the first extended portions, while a second set of contacts may be connected to a first surface of the second extended portions. A mold-locking cavity having the mold material included therein may be disposed in contact with a second surface of the first extended portions opposed to the first surface of the first extended portions, a second surface of the second extended portions opposed to the first surface of the second extended portions, the first portion of the leadframe, and the second portion of the leadframe.

13 Claims, 18 Drawing Sheets

(51) Int. Cl.
*H01L 23/31* (2006.01)
*H01L 23/482* (2006.01)
*H01L 23/00* (2006.01)
*H01L 23/544* (2006.01)

(52) U.S. Cl.
CPC ...... *H01L 23/3142* (2013.01); *H01L 23/4824* (2013.01); *H01L 23/4951* (2013.01); *H01L 23/49568* (2013.01); *H01L 23/544* (2013.01); *H01L 23/562* (2013.01); *H01L 2223/54426* (2013.01); *H01L 2223/54486* (2013.01); *H01L 2224/26175* (2013.01); *H01L 2224/27013* (2013.01); *H01L 2224/32258* (2013.01)

(58) Field of Classification Search
CPC ......... H01L 23/49544; H01L 23/49548; H01L 23/49551; H01L 23/49562; H01L 23/49568; H01L 23/3107; H01L 2224/16245; H01L 2224/16258; H01L 2224/81007; H01L 2224/03013; H01L 2224/10175; H01L 2224/11013; H01L 2224/2617; H01L 2224/27013; H01L 2224/32245; H01L 2224/32258; H01L 29/41758

See application file for complete search history.

(56) References Cited

U.S. PATENT DOCUMENTS

| | | |
|---|---|---|
| 2008/0048218 A1 | 2/2008 | Jiang |
| 2008/0230878 A1 | 9/2008 | Lu et al. |
| 2016/0240471 A1 | 8/2016 | Klowak et al. |
| 2016/0247748 A1* | 8/2016 | Kinzer ............... H01L 23/3107 |
| 2016/0307826 A1* | 10/2016 | McKnight-MacNeil .................... H01L 24/17 |
| 2018/0040540 A1 | 2/2018 | Kasuya et al. |
| 2018/0138134 A1 | 5/2018 | Chikamatsu et al. |

OTHER PUBLICATIONS

CITC Chip Integration Technology Center, "Integration for Tomorrow," Apr. 1, 2020.

High Power GaN in plastic transistors, Microwave Journal, by M/A-COM Technology Solutions Inc. (MACOM), Aug. 14, 2013.

* cited by examiner

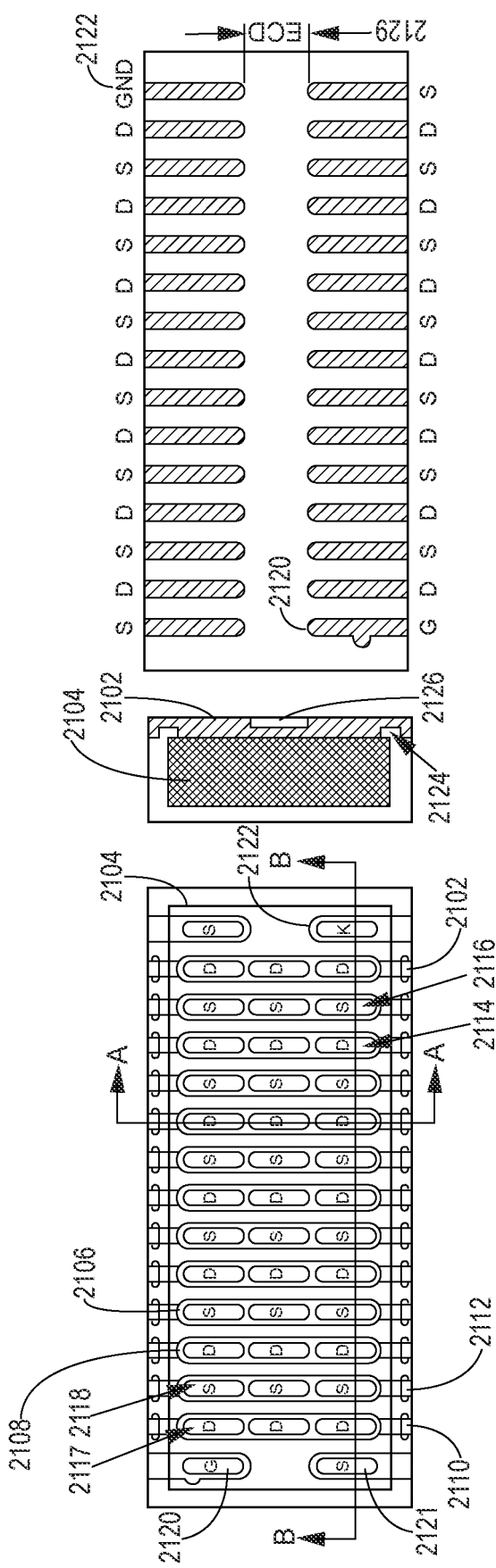
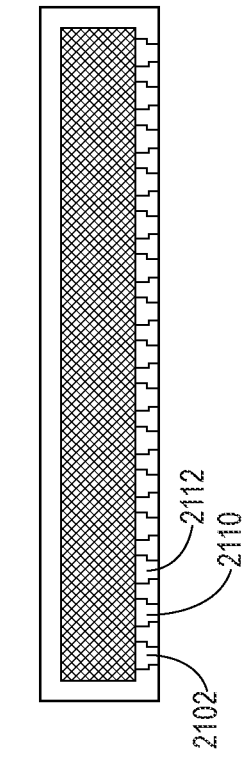

MOLDED PACKAGING FOR WIDE BAND GAP SEMICONDUCTOR DEVICES

TECHNICAL FIELD

This description relates to semiconductor packaging techniques for wide band gap semiconductor devices.

BACKGROUND

Wide band gap (WBG) semiconductor devices provide many advantages over traditional (e.g., Silicon) semiconductor devices. For example, WBG semiconductor devices are generally able to operate at higher voltages, frequencies, and temperatures than traditional semiconductor devices, and typically provide higher power efficiency.

However, various aspects of WBG devices may make it difficult to fully realize the types of advantages referenced above. For example, WBG devices tend to be more brittle or fragile than traditional semiconductor devices. As a result, WBG devices are more susceptible to malfunction than traditional semiconductor devices.

SUMMARY

According to one general aspect, a semiconductor device package may include a leadframe, the leadframe having a first portion with first extended portions and a second portion with second extended portions, the first extended portions being interdigitated with the second extended portions. The semiconductor device package may include mold material encapsulating at least a portion of the leadframe and at least a portion of a semiconductor die electrically mounted to the leadframe, the semiconductor die having a first set of contacts alternated with a second set of contacts, with the first set of contacts connected to a first surface of the first extended portions and the second set of contacts connected to a first surface of the second extended portions. The semiconductor device package may include a mold-locking cavity having the mold material included therein and in contact with a second surface of the first extended portions opposed to the first surface of the first extended portions, a second surface of the second extended portions opposed to the first surface of the second extended portions, the first portion of the leadframe, and the second portion of the leadframe.

According to another general aspect, a semiconductor device package may include a leadframe having a source portion and a drain portion, the source portion having source extended portions extending towards the drain portion and having source contact pads, and the drain portion having drain extended portions extending toward the source portion and having drain contact pads. The semiconductor device package may include a semiconductor die having alternating source contacts and drain contacts provided thereon, the source contacts being connected to the source contact pads and the drain contacts being connected to the drain contact pads. The semiconductor device package may include a mold locking cavity defined by surfaces of the source extended portions and the drain extended portions that are opposite the source contact pads and the drain contact pads, and mold material encapsulating at least a portion of the leadframe and at least a portion of the semiconductor die, and filling the mold locking cavity including contacting the surfaces of the source extended portions and the drain extended portions.

According to another general aspect, a method of making a semiconductor device package may include providing a semiconductor die having alternating source contacts and drain contacts on a leadframe, the leadframe having a source portion and a drain portion, the source portion having source extended portions extending towards the drain portion and having source contact pads, and the drain portion having drain extended portions extending toward the source portion and having drain contact pads. The method may include connecting the source contacts to the source contact pads and the drain contacts to the drain contact pads, and encapsulating at least a portion of the leadframe and at least a portion of the semiconductor die with a mold material, including filling a mold locking cavity defined by surfaces of the source extended portions and the drain extended portions that are opposite the source contact pads and the drain contact pads, with the mold material contacting the surfaces of the source extended portions and the drain extended portions.

The details of one or more implementations are set forth in the accompanying drawings and the description below. Other features will be apparent from the description and drawings, and from the claims.

BRIEF DESCRIPTION OF THE DRAWINGS

FIG. 21A is a top view of an example package layout for a WBG die that includes a co-planar ground contact and alternating drain and source terminals.

FIG. 21B is a first cross section side view of the example implementation of FIG. 21A.

FIG. 21C is a second cross section side view of the example implementation of FIG. 21A.

FIG. 21D is a package bottom view of the example implementation of FIG. 21A.

DETAILED DESCRIPTION

Wide band gap (WBG) semiconductor devices have many desirable properties, but are difficult to package in a reliable, low cost, high throughput manner. Techniques described herein may be utilized to provide such reliable, low cost, high throughput packaging of WBG semiconductor devices, using, e.g., flip-mounting of a WBG die on a leadframe that has alternating, extended portions (e.g., interdigitated portions), and that provides a mold-locking cavity. Then, suitable mold materials may be used to encapsulate desired portions of the leadframe and the WBG die, including filling the mold-locking cavity formed by the alternating, extended portions. Accordingly, even when the WBG die is brittle or otherwise susceptible to mechanical stress, the resulting package is mechanically stable and enables use of the WBG die in high power and other specialized settings, without sacrificing electrical or thermal performance aspects of the WBG die.

Example implementations may comply with other packaging requirements of various types of WBG dies. In particular, WBG dies of varying sizes and dimensions may be packaged using the described techniques. Further, creepage distance requirements for all such WBG dies may be met. Additionally, standard solder connections and other inexpensive, available techniques may be used to implement the described techniques.

In some implementations, the extended, alternating portions have first surfaces to which the WBG is flip-mounted, and second, opposed surfaces that define the mold-locking cavity. For example, the mold-locking cavity may be provided as a space(s) between the second surfaces of the extended, alternating portions and a plane defined by surfaces of leadframe portions from which the extended, alternating portions extend. In some implementations, the mold-locking cavity may be provided by topsetting the extended, alternating portions of the leadframe. In other implementations, the mold-locking cavity may be provided by using a relatively thick, half-etched leadframe.

Figure 1:
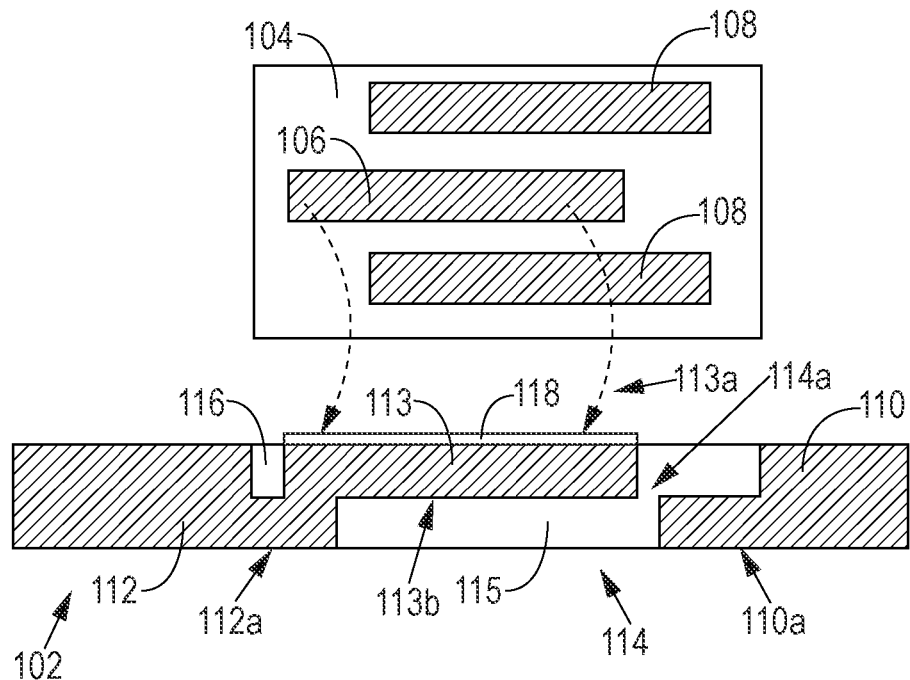
FIG. 1 is a simplified, partially exploded view of a molded package for wide band gap semiconductor devices.

FIG. 1 is a simplified, partially exploded view of a molded package for WBG semiconductor devices. FIG. 1 illustrates a cross-section side view of a leadframe 102, and a bottom view of a portion of a WBG die 104, where the WBG die portion 104 includes a source contact 106 and drain contacts 108. More generally, as illustrated and described below, a WBG die as used herein may include a plurality of alternating source contacts and drain contacts (including the source contact 106 and the drain contacts 108), as well as a gate contact. In some implementations, a Kelvin sense contact and ground contact may be included, as well.

The leadframe 102 includes a first portion 110 and a second portion 112. The second portion 112 is illustrated as including an extended portion 113, which has a first surface 113a to which the WBG die 104 may be attached, and a second, opposed surface 113b that partially defines a mold-locking cavity 114. As shown, the mold-locking cavity 114 is defined at least between the second surface 113b of the extended portion 113 and a plane defined by surfaces 110a, 112a of leadframe portions 110, 112, respectively. The mold-locking cavity 114 includes an opening 114a between the leadframe portion 110 and the leadframe portion 112, through which mold material 115 may fill the mold-locking cavity 114. Not shown in FIG. 1, but described in detail below, the mold material 115 may further encapsulate some or all of the leadframe 102 and the WBG die 104, in addition to filling the mold-locking cavity 114. The mold-locking cavity 114 may be formed by half-etching of the leadframe 102.

Also in FIG. 1, a canal 116 formed in the leadframe portion 112 may provide solder overflow protection, which prevents a solder layer 118 from overflowing or extending along the leadframe portion 112 any farther than the canal 116. The solder layer 118 may thus be formed accurately on the extended portion 113, so that the source contact 106 may be soldered to the extended portion 113, as indicated by the dashed lines in FIG. 1 between the source contact 106 and the solder layer 118.

Not visible in FIG. 1, but illustrated and described in detail below, e.g., with respect to FIG. 2, the extended portion 113 is but one of a plurality of alternating, extended portions of the leadframe 102 (i.e., of leadframe portions 110, 112), which align with the alternating source and drain contacts 106, 108 of the WBG die 104. That is, in the simplified example of FIG. 1, the leadframe portion 110 should be understood to include at least two extended portions that would align with the drain contacts 108. More generally, the leadframe portion 112 (which may also be referred to as source leadframe portion 112) includes a plurality of extended portions (including the extended portion 113), all of which are in electrical contact with (at least portions of) corresponding source contacts (including the source contact 106) of the WBG die 104. Similarly, the leadframe portion 110 (which may also be referred to as drain leadframe portion 110) includes a plurality of extended portions, all of which are in electrical contact with (at least portions of) corresponding drain contacts (including the drain contacts 108) of the WBG die 104.

The resulting packaging structure, and various example implementations thereof, provide mechanical stability, while enabling full realization of the electrical and thermal properties of the WBG die 104. The described design may be implemented in many different ways, examples of which are provided below. For example, the alternating, extended portions of the leadframe 102, such as the extended portion 113, may be cantilevered, or may be topsetted. The alternating, extended portions may be interdigitated. The alternating, extended portions may be kept out of contact with (may be unsupported by) an opposed leadframe portion (e.g., the extended portion 113 is not supported by the leadframe portion 110), or may be attached thereto. The alternating, extended portions may be connected to the WBG die 104 (and to source contacts 106 and drain contacts 108) using a redistribution layer (RDL). With these and other variations of implementations of the example of FIG. 1, it is possible to accommodate many different types, sizes, and dimensions of various WBG dies.

Figure 2:
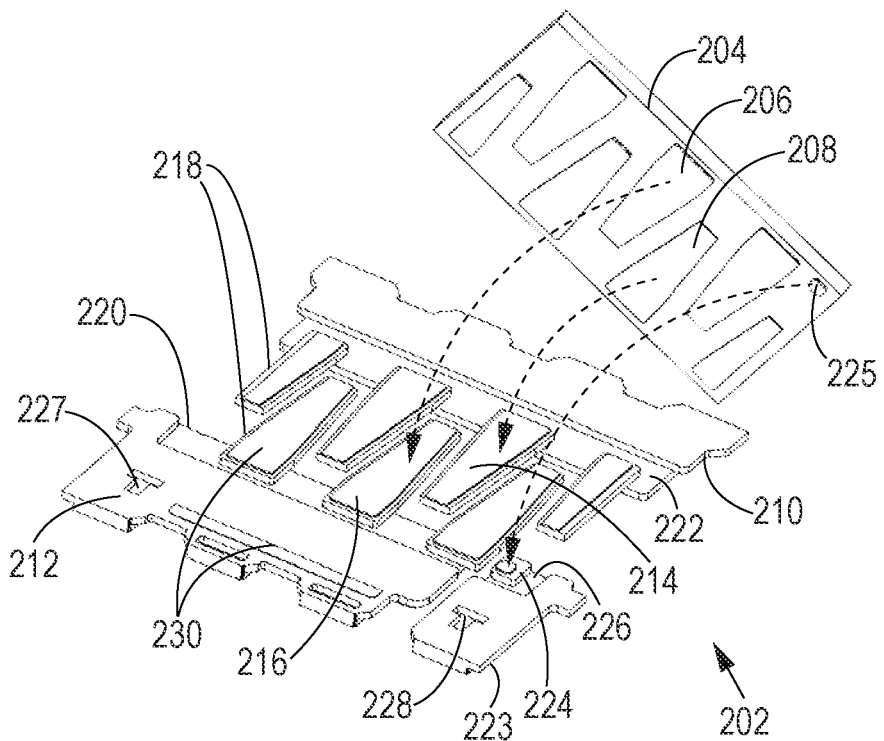
FIG. 2 is a three-dimensional top view of an example, partially-assembled implementation of the molded package for wide band gap semiconductor devices of FIG. 1.

FIG. 2 is a three-dimensional top view of an example, partially-assembled implementation of the molded package for wide band gap semiconductor devices of FIG. 1. In FIG. 2, a leadframe 202 is used for mounting a WBG die 204, which includes a source contact 206 and a drain contact 208 of a plurality of alternating source contacts and drain contacts, as shown.

The leadframe 202 includes drain leadframe portion 210, to be connected to the drain contact(s) 208, and source leadframe portion 212, to be connected to the source contact (s) 206. By way of specific example, an extended portion 214, e.g., including a drain contact pad, of the drain leadframe portion 210, may be soldered to the drain contact 208, while an extended portion 216, e.g., including a source contact pad, of the source leadframe portion 212 may be soldered to the source contact 206. Thus, the extended portion 214 may be referred to as a drain extended portion 214, and the extended portion 216 may be referred to as a source extended portion 216.

More generally, the drain extended portion 214 and the source extended portion 216 may be understood to be included in, or represent, a plurality of alternating, extended leadframe portions, which in the example of FIG. 2 may be referred to as interdigitated contact pads 218. As shown and described, the interdigitated contact pads 218 correspond to the source contact(s) 206 and the drain contact(s) 208 of the WBG die 204, and enable flip-chip mounting thereof. Moreover, the interdigitated contact pads 218 provide a high degree of mechanical support for the WBG die 204, while enabling use of widely-available and inexpensive components and connection techniques.

Further in FIG. 2, the leadframe 202 includes etched canals 220. For example, the leadframe 202 may be formed of a relatively thick material, e.g., sufficiently thick to enable formation of half-etched canals 220, 222. The half-etched canals 220, 222 may be formed around the source extended portions 216 and the drain extended portions 214, respectively, as shown. The half-etched canals 220, 222 enable solder overflow protection, which enables accurate soldering of the source contact(s) 206 and the drain contact(s) 208 to the source extended portion(s) 216 and the drain extended portion(s) 214, while avoiding potential short-circuits of the WBG die 204 to the leadframe 202. Further, the half-etched canals 220, 222 provide a path for encapsulating mold material to fill a mold-locking cavity of the leadframe 202, and to generally encapsulate the leadframe 202 and the WBG die 204. Examples of such mold material and mold-locking cavity are not enumerated or illustrated explicitly in FIG. 2, but may be similar to the mold material 115 and mold-locking cavity 114 of FIG. 1, and are described in more detail below, e.g., with respect to FIGS. 3 and 4.

In FIG. 2, a leadframe portion 223 of the leadframe 202 provides a gate contact pad 224. Similar to the source and drain connections already described, the gate contact pad 224 may be soldered to a gate contact 225 of the WBG die 204, and may be attached to the leadframe portion 223 using a half-etched canal 226.

Alignment fiducials 227, 228 may be used to perform accurate alignment of the leadframe 202 and the WBG die 204. Use of the alignment fiducials 227, 228 provides a reference point(s) for ensuring proper placement of the WBG die 204, as illustrated in more detail in the example assembly process of FIG. 8.

Figure 8:
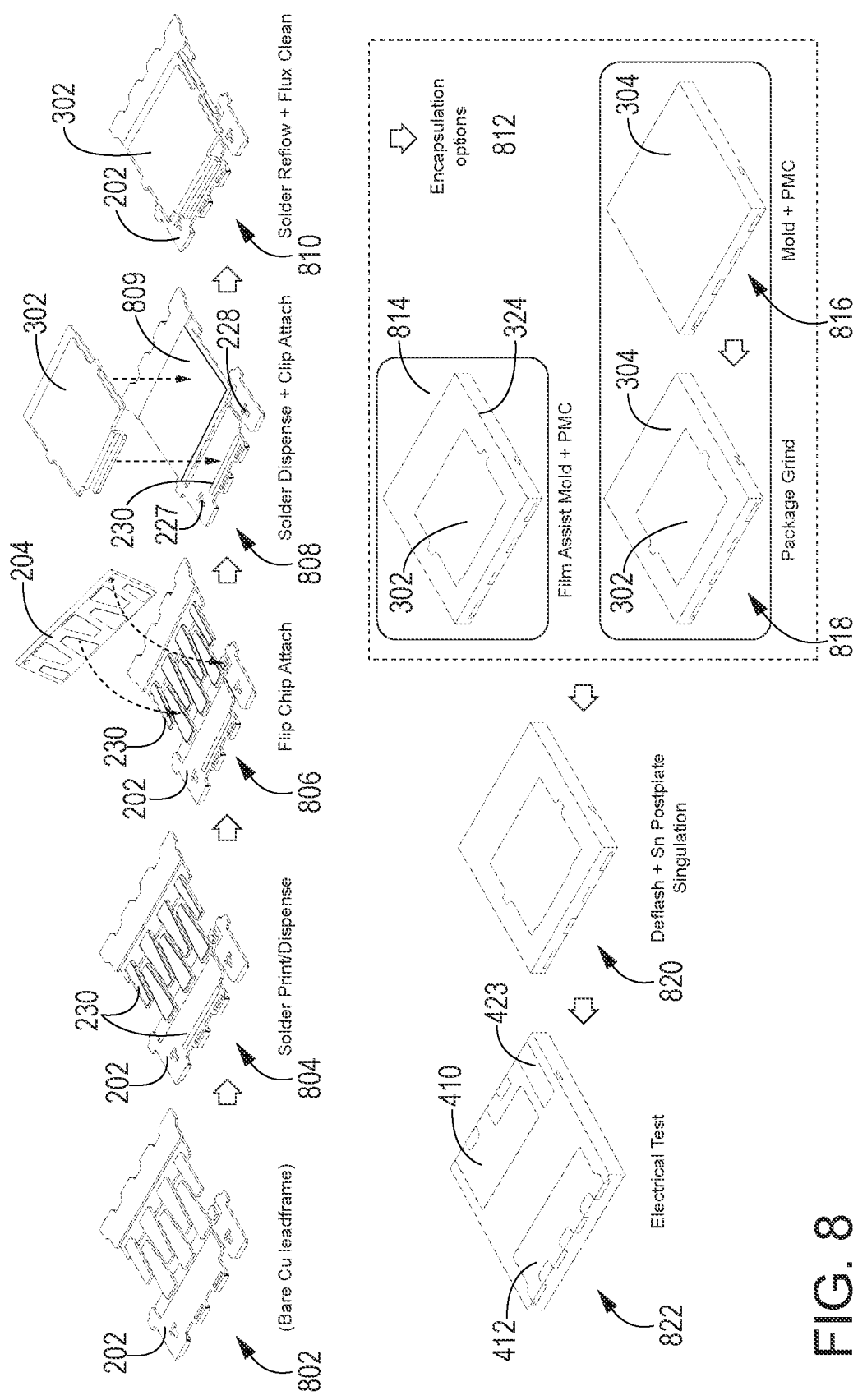
FIG. 8 illustrates an example process flow for constructing the example implementation of FIGS. 2-7.

As also illustrated in more detail with respect to FIG. 8, solder 230 may be placed appropriately on the various interdigitated source/drain contact pads 218, as well as on the gate contact pad 224 and on the leadframe portion 212. The solder 230 may thus enable desired connections of the WBG die 204, and other desired connections (e.g., a grounding clip and/or heatsink materials, in examples described below).

Figure 3:
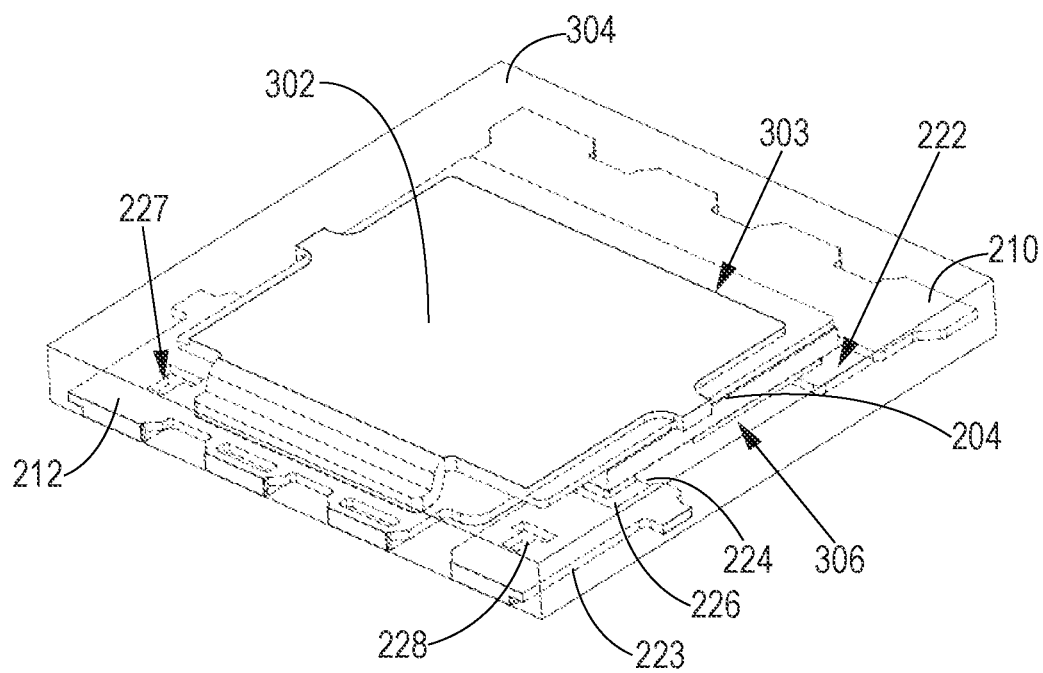
FIG. 3 is a three-dimensional top view of the example of FIG. 2, fully assembled.
Figure 4:
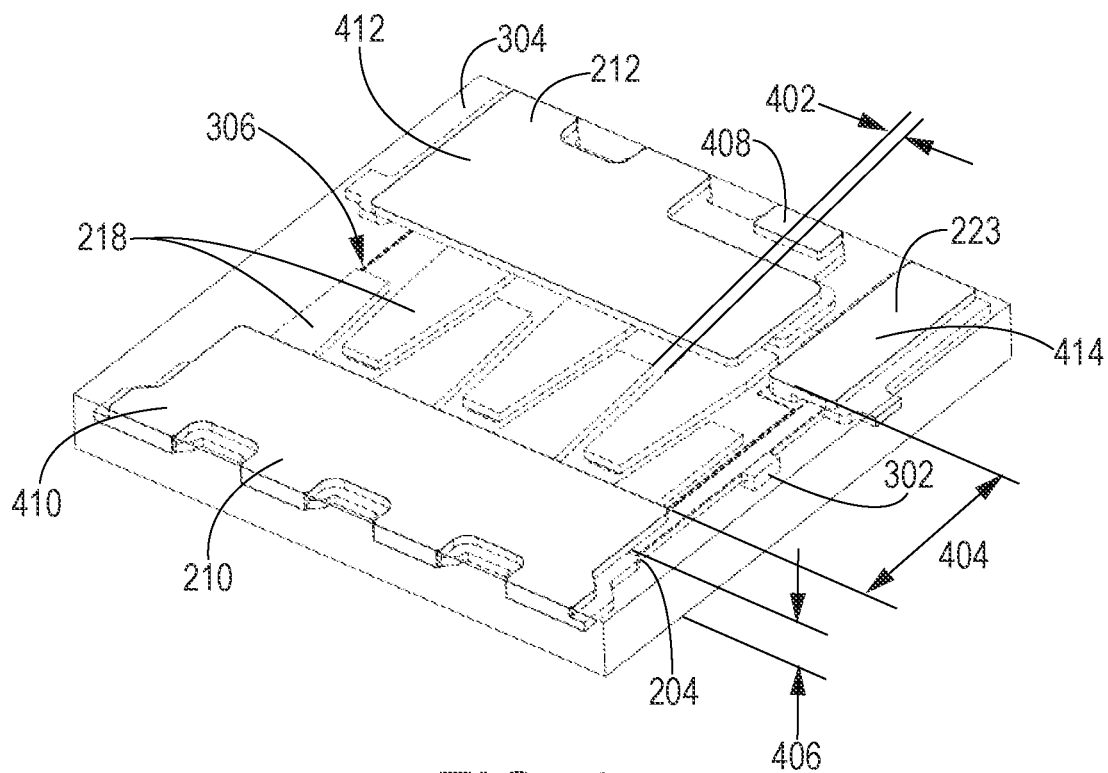
FIG. 4 is a three-dimensional bottom view of the example of FIG. 2, fully assembled.

FIG. 3 is a three-dimensional top view of the example of FIG. 2, fully assembled. FIG. 4 is a three-dimensional bottom view of the example of FIG. 2, fully assembled. FIG. 3 further illustrates a clipbond heatsink 302, which may be half-etched for locking and isolation purposes, as illustrated in more detail with respect to FIG. 5. FIG. 3 illustrates encapsulation of the leadframe 202 and the WBG die 204 with mold material 304. FIG. 3 further illustrates a mold-locking cavity 306, analogous to the mold-locking cavity 114 of FIG. 1, which is more easily visible in (and explained in more detail with respect to) the cross section side views of FIGS. 5, 6, and 7.

FIG. 3 illustrates suitable example implementations when the WBG die 204 does not provide a ground connection or terminal on a surface of the WBG die 204 attached to the leadframe 202. In such cases, if the source contacts 206 will be grounded through the source leadframe portion 212, then the clipbond heatsink 302 may be soldered to the source leadframe portion 212, and thus may be connected to the source contacts 206, and grounded, e.g., through a circuit board to which the package of FIG. 3 will be connected. The clipbond heatsink 302 also facilitates thermal dissipation.

The mold material 304 may be any suitable mold material, such as, e.g., an Epoxy Molding Compound (EMC) mold material. In particular, the mold material 304 may be selected as a low stress mold material that also provides good thermal dissipation and high dielectric values.

FIG. 4 illustrates an internal creepage distance 402 and an external creepage distance 404. In general, creepage distance refers to a shortest distance along an insulator between two conducting elements (e.g., source and drain), so that creepage is associated with device failure or malfunction, and should be avoided. In FIG. 4, the internal creepage distance 402 refers to the illustrated shortest distance between a pair of a source contact 206 and a drain contact 208. The external creepage distance 404 refers to the illustrated distance between the drain leadframe portion 210 and the source leadframe portion 212.

Creepage distances 402, 404 defined for the leadframe 202 may be determined based on factors related to the WBG 204 implementation being packaged. For example, in general, the creepage distances 402, 404 may be selected and designed in direct proportion to a voltage rating of the WBG die 204 and desired applications, so that a higher voltage rating requires a larger creepage distance.

Figure 6:
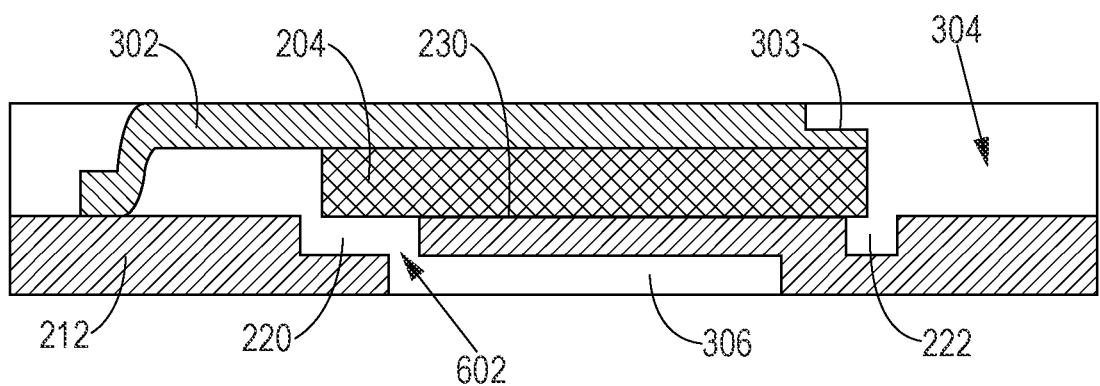
FIG. 6 is a second cross section, side view of the example implementation of FIGS. 2-4.

Further, in the example of FIGS. 3 and 4, because the clipbond heatsink 302 is grounded with the source contacts 206, a cross-package creepage distance 406 exists between the clipbond heatsink 302 and the drain contacts 208 (e.g., in a vertical direction in the cross section views of FIG. 6, and along a side of the illustrated package). As a result, in FIGS. 3 and 4, it may be desirable to limit a size of the clipbond heatsink 302 to ensure that the specified minimum creepage distance is maintained.

FIG. 4 further illustrates a Kelvin terminal 408, included to perform Kelvin sensing for improved switching efficiency. An exposed drain pad 410, exposed source pad 412, and exposed gate pad 414 are also illustrated.

Figure 5:
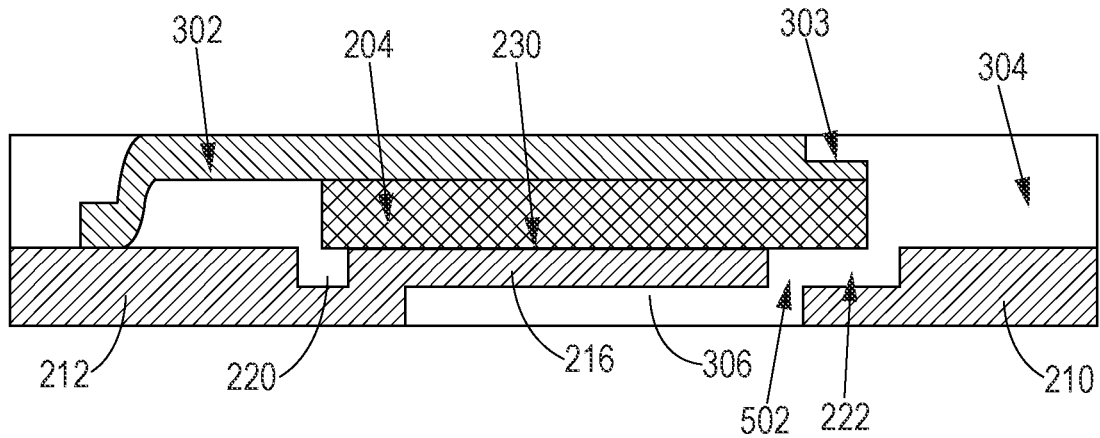
FIG. 5 is a first cross section, side view of the example implementation of FIGS. 2-4.
Figure 7:
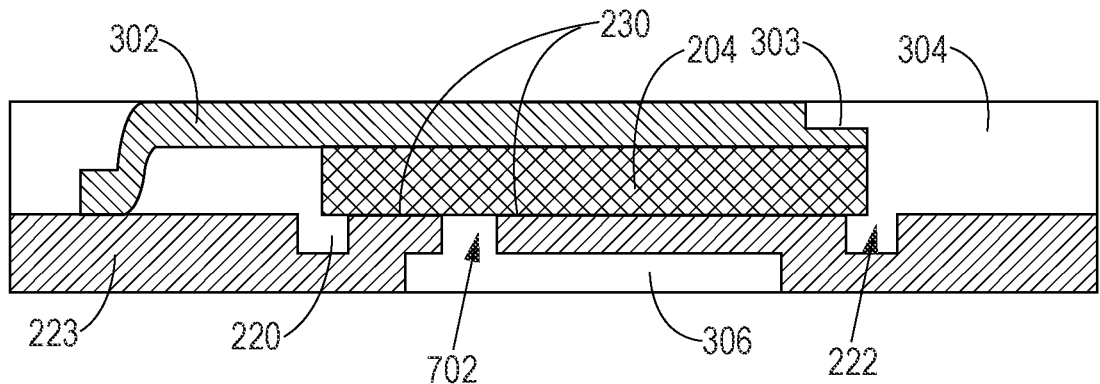
FIG. 7 is a third cross section, side view of the example implementation of FIGS. 2-4.

The mold-locking cavity 306 is thus formed between a surface of the drain extended portion(s) 214 and the source extended portion(s) 216 facing the exposed pads 410, 412, 414, and the exposed surfaces of the exposed pads 410, 412, 414, as is more easily visible in FIGS. 5-7. The mold-locking cavity 306, in combination with the extended alternating portions of the leadframe 202, e.g., the half-etched cantilevered contact pads 214, 216 of FIGS. 2-4, enable a large surface area in which the mold material 304 is in contact with the leadframe 202, and thereby increase the overall mechanical stability of the resulting package.

A thickness of the leadframe 202 may be selected to optimize a depth of the mold-locking cavity 306. For example, depending on various factors such as a size and voltage rating of the WBG die 204 and the associated creepage distances, 402, 404, 406, and other design requirements, the leadframe 202 may be selected to be, e.g., 10 mm, 15 mm, 20 mm, or more, resulting in a deeper mold-locking cavity 306 and enhanced stability associated with use of larger amounts of the mold material 304 therein.

For example, in the implementations of FIGS. 2-8 in which the half-etching of the leadframe 202 is used to provide the solder overflow canals 220, 222, design parameters for associated etch depths may be selected to optimize package mechanical stability relative to the creepage distances 402, 404, 406, and relative to overall size requirements/constraints for the package. More generally, FIG. 4 illustrates that absolute and relative sizes of the extended portions (interdigitated, half-etched, cantilevered contact pads) 214, 216 may be easily selected and configured to meet such design requirements, across a range of WBG die sizes and applications.

FIG. 5 is a first cross section, side view of the example implementation of FIGS. 2-4. FIG. 6 is a second cross section, side view of the example implementation of FIGS. 2-4. FIG. 7 is a third cross section, side view of the example implementation of FIGS. 2-4.

FIGS. 5-6 illustrate an example of the mold-locking cavity 306 in more detail. For example, analogous to the opening 114a of FIG. 1, an opening 502 in FIG. 5 and an opening 602 in FIG. 6 facilitate filling of the mold-locking cavity 306 with the mold material 304, as well as increased areas for mold locking between the mold material 304 and the WBG die 204. Similarly, an opening or space 702 in FIG. 7 facilitates mold locking between the mold material 304 and the WBG die 204.

FIGS. 5-7 further illustrate a nature and operation of the solder overflow canals 220, 222. As shown, and as described in more detail, below, with respect to FIG. 8, the solder overflow canals 220, 222 ensure that any excess solder 230 applied to the leadframe 202 will not establish an electrical connection, and thus a potential short-circuit, between the WBG die 204 and the leadframe 202.

FIG. 8 illustrates an example process flow for constructing the example implementation of FIGS. 2-7. In FIG. 8, the example process flow begins (802) with the leadframe 202 as a bare metal leadframe, e.g., a Copper (Cu) leadframe, having the various features described and illustrated above with respect to FIGS. 2-7. Printing (804) or other dispensing of the solder 230 may then proceed. As described, solder overflow may be prevented by use of the canals 220, 222.

Flip attaching (806) of the WBG die 204 may then proceed, followed by further dispensing of solder 809 and corresponding attachment (808) of the clipbond heatsink 302 using the solder 809 and remaining exposed portions of the solder 230. Alignment fiducials 227 and 228 on leadframe portion 212 provide visual reference points for proper placement of the WBG die 204 and clipbond heatsink 302 on attachment to the leadframe 202. Solder reflow and cleaning (e.g., flux immersion cleaning) (810) may then facilitate proceeding to one of a plurality of encapsulation options (812) for applying the mold material 304, while still exposing the clipbond heatsink 302.

For example, a film assist mold process with post-mold curing (PMC) (814) may be used. In the film assist mold process, a mold release film is used to expose the clipbond heatsink 302. Meanwhile, PMC uses increased temperature to decrease a time required for the curing process and to optimize desired physical properties of the mold material 304. Alternatively, a molding process combined with PMC may be used (816), followed by a package grind (818) to expose the clipbond heatsink 302.

In the example of FIG. 8, package singulation (820) may be performed, in conjunction with deflashing of any excess mold material flashing, as well as tin (Sn) postplating. In other example implementations, the leadframe 202 and the clipbond heatsink 302 may be pre-plated with NiPdAu (Nickel Palladium Gold), in which case the deflashing and Sn postplating processes may be eliminated. Finally in FIG. 8, electrical testing (822) may finalize the packaging process.

Figure 9:
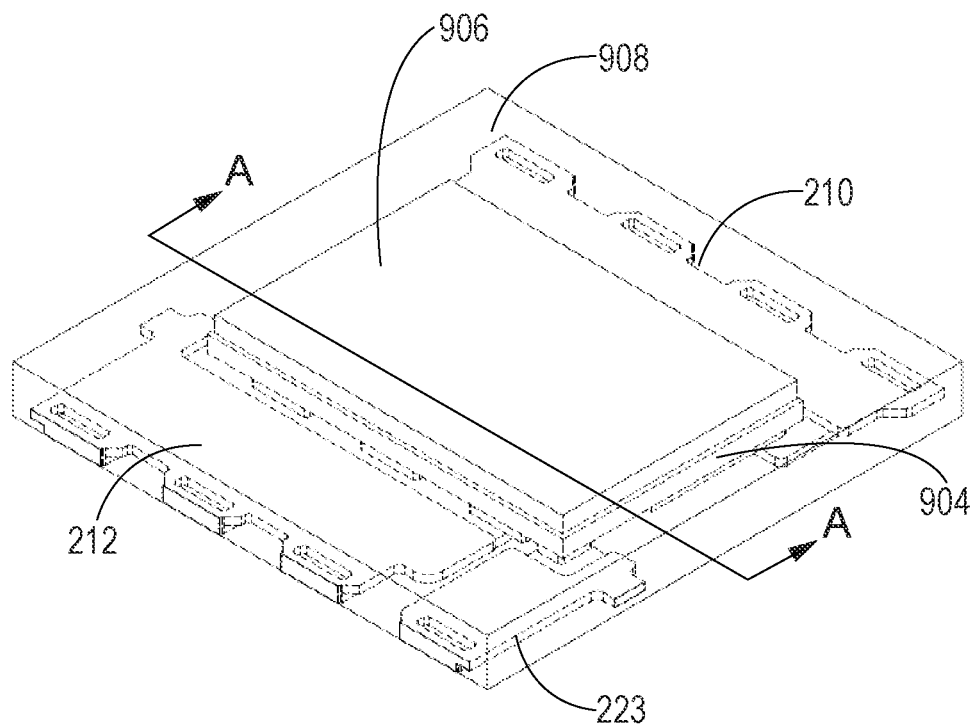
FIG. 9 illustrates a three-dimensional top view of an alternate example implementation of the implementation of FIGS. 2-8.
Figure 10:
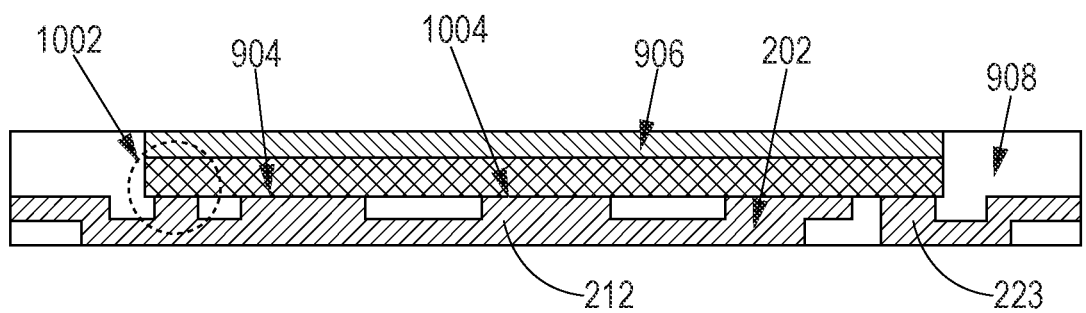
FIG. 10 is a cross section, side view of the example implementation of FIG. 9.

FIG. 9 illustrates a three-dimensional top view of an alternate example implementation of the implementation of FIGS. 2-8. FIG. 10 is a cross section, side view of the example implementation of FIG. 9, taken along line A-A.

In FIGS. 9 and 10, A WBG die 904 includes a grounding terminal 1002, as is visible in FIG. 10. Accordingly, it is not necessary to include a clipbond heatsink 302 as in the implementations of FIGS. 3-8. As a result, multiple options may be used for providing heat shielding and/or for providing encapsulating mold material 908 with respect to the mold material 908, and/or to the WBG die 904.

FIGS. 9 and 10 illustrate an example of a dual cool, shielded exposed die implementation, in which a shield 906 is disposed on the WBG die 904. The shield 906 may be formed using, e.g., a suitable ceramic material, or copper. For example, for larger creepage distances, a nonconductive shield such as ceramic may be used (so that a vertical creepage distance will not be compromised), but if available creepage distance permits, then a conductive metal, such as copper, may be used.

In the example of FIGS. 9-10, the mold material 908 is formed as a thin overmold for the shield 906, as shown. In FIG. 10, a high-melt solder joint 1004 is used to mount the WBG die 904 to the leadframe 202. The mold material 908 may be selected as having a relatively high thermal efficiency.

Figure 11:
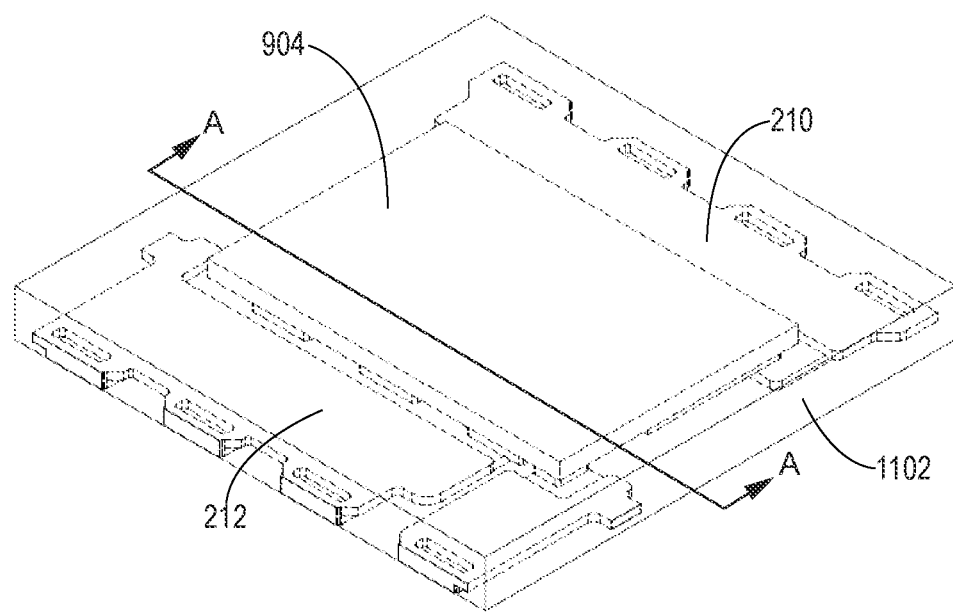
FIG. 11 illustrates a three-dimensional top view of another alternate example implementation of the implementation of FIGS. 9-10.
Figure 12:
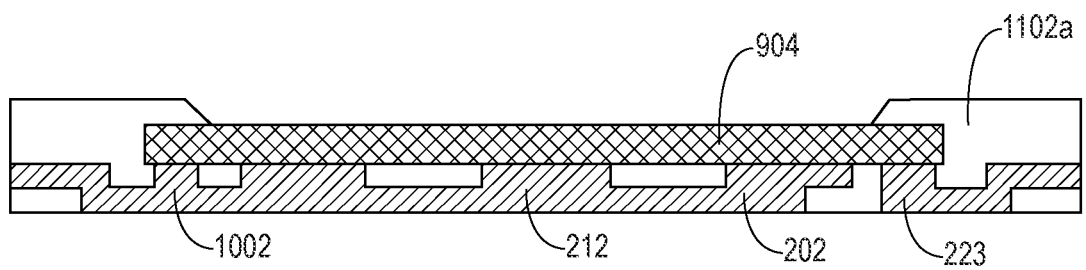
FIG. 12 is a cross section, side view illustrating a first example implementation of the example implementation of FIG. 11.
Figure 13:
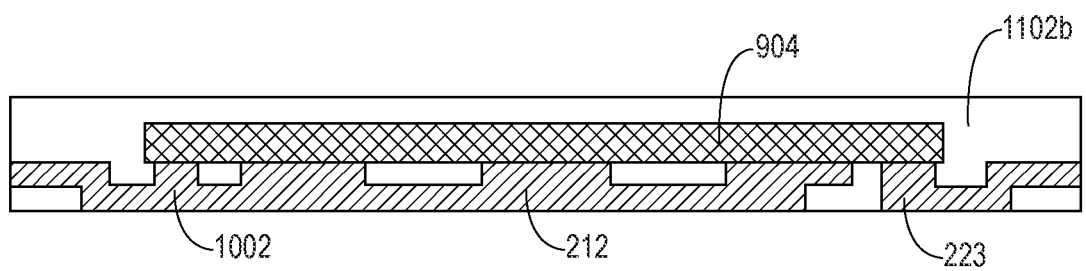
FIG. 13 is a cross section, side view illustrating a second example implementation of the example implementation of FIG. 11.

FIG. 11 illustrates a three-dimensional top view of another alternate example implementation of the implementation of FIGS. 9-10. FIG. 12 is a cross section, side view illustrating a first example implementation of the example implementation of FIG. 11, taken along line A-A. FIG. 13 is a cross section, side view illustrating a second example implementation of the example implementation of FIG. 11, taken along line A-A.

FIGS. 11-13 illustrate that multiple options are available for forming the encapsulating mold material 1102, and for thus implementing different approaches to cooling the package of FIG. 11. For example, FIG. 12 illustrates a dual cool option with a top exposed die 904, since, as shown in FIG. 12, the WBG die 904 is partially exposed by the encapsulation option shown as mold material 1102a. Such an option provides direct cooling of the WBG die 904, but is more likely to expose the WBG die 904 to potential damage.

FIG. 13 illustrates a single cool, overmolded option, in which the WBG die 904 is overmolded by the mold material 1102b, e.g., a high thermal efficiency mold material as in FIGS. 9-10. In contrast to the example implementation of FIG. 12, the implementation of FIG. 13 potentially provides less cooling, but with additional protection of the WBG die 904. The overmolding options of FIGS. 10 and 13 may be implemented, e.g., using film assisted molding, or by grinding after overmolding.

In contrast to the examples of FIGS. 3-8, in which the clipbond heatsink 302 is used to provide grounding and is source-connected, the implementations of FIGS. 9-13 enables relatively larger sizes of the heatsink shield 906 in FIGS. 9, 10, and generally enables the use of larger die sizes in FIGS. 9-13 as compared to FIGS. 3-8.

In the various implementations described herein, including those of FIGS. 1-13, the flip mounting or flip-chip mounting of the WBG die 204, 904, enables a low-resistance, low-inductance package configuration that enables an efficient electrical performance of the package (e.g., providing a reduced current path from die to board). In particular, electrical connections provided through the thick leadframe 202 enable high-performance mounting of the WBG die 204, 904, while various top half-etched canals prevent solder overflow from leading to short-circuit events. Further, the described leadframe layout provides sufficient dielectric material thickness to guard against high voltage arcing that may occur due to superficial cracks that may occur in the encapsulating mold material.

In various implementations, source extended portions and drain extended portions may extend at least a majority of a distance between a source leadframe portion and a drain leadframe portion, and, as shown, may be interdigitated. Alternatively, as illustrated and described below, source extended portions and drain extended portions may extend less than a majority of a distance between the source leadframe portion and the drain leadframe portion.

Elongated, interdigitated source/drain portions providing contact pads may significantly increase a contact area between mold material and leadframe, while a thick etched leadframe provides additional mold volume underneath the half-etched contact pads. Further, high voltage rating is enabled, e.g., either by the thick leadframe layout described above using long half-etched areas, or through topsetted leadframes, as referenced above and described below with respect to FIGS. 14-16.

Figure 14:
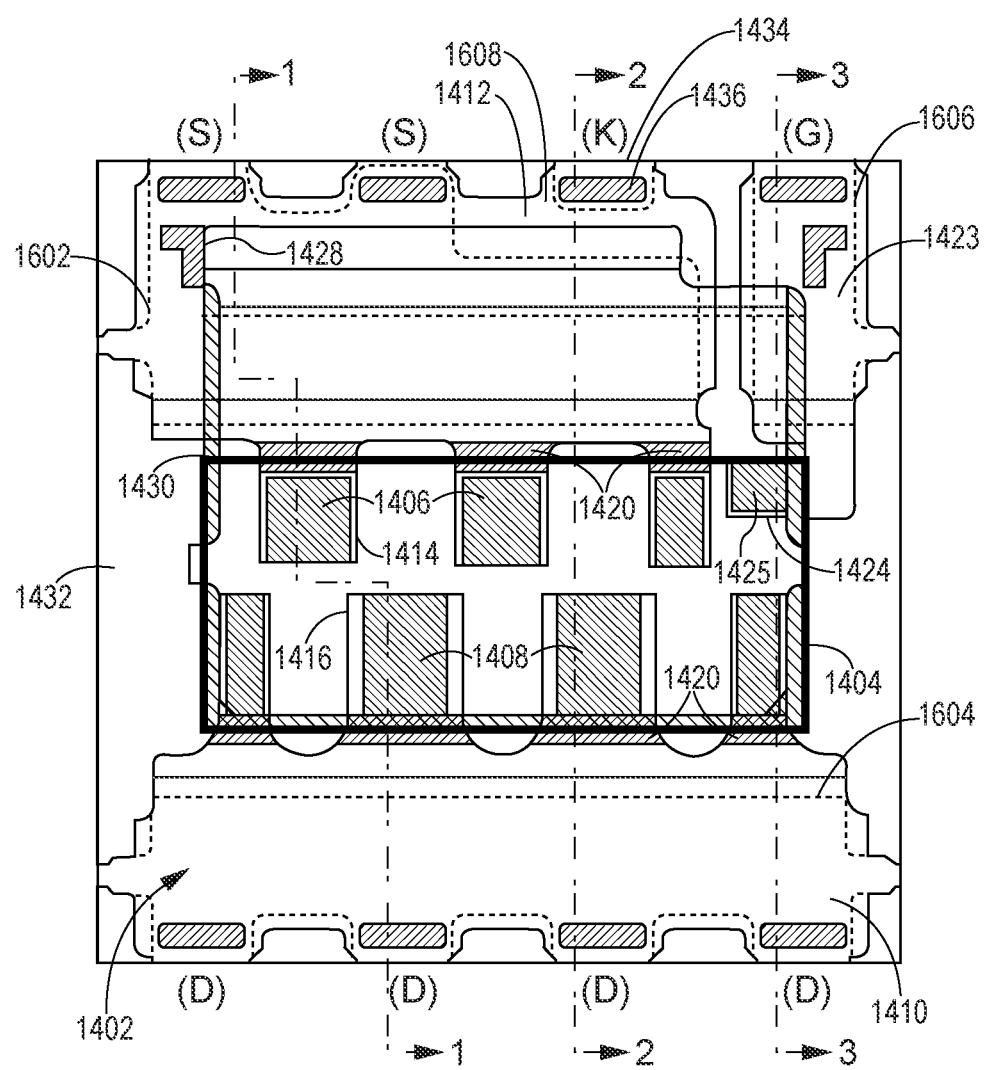
FIG. 14 is a transparent top view of an example implementation of the package of FIG. 1, with topsetted contact portions.
Figure 15A:
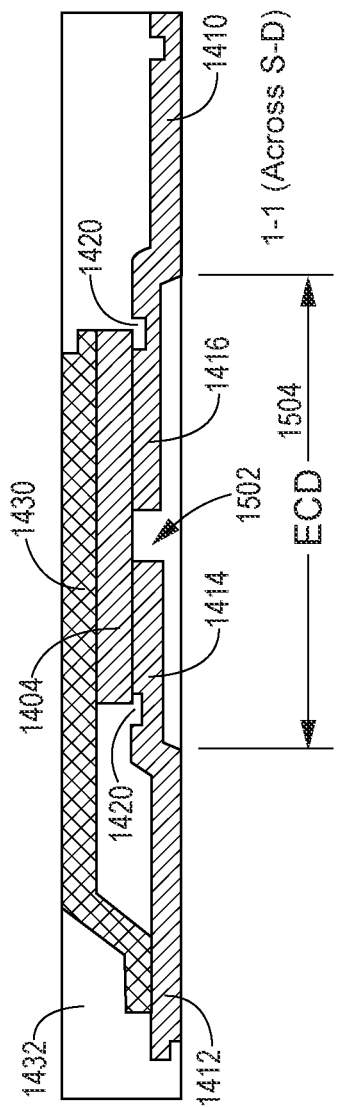
FIG. 15A is a first cross section, side view of the example implementation of FIG. 14.
Figure 15B:
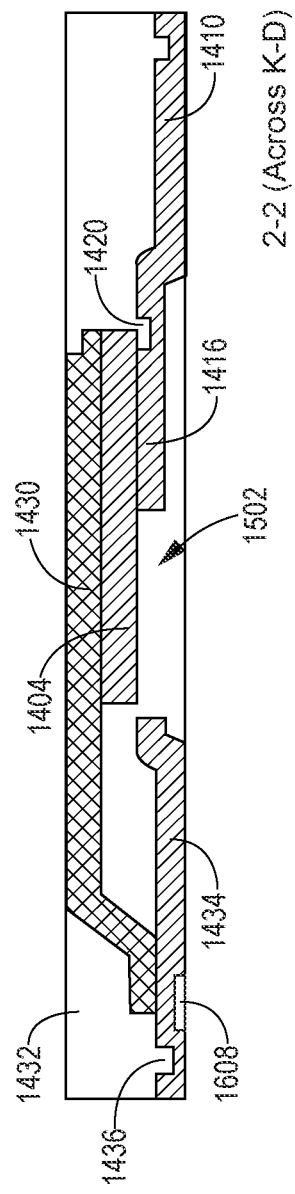
FIG. 15B is a second cross section, side view of the example implementation of FIG. 14.
Figure 15C:
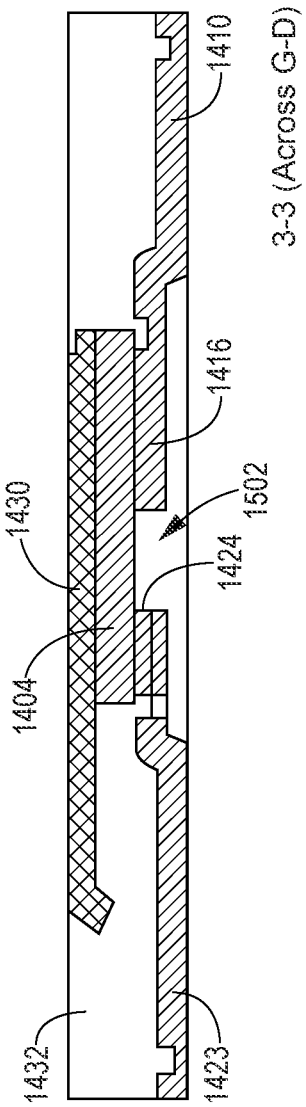
FIG. 15C is a third cross section, side view of the example implementation of FIG. 14.
Figure 16:
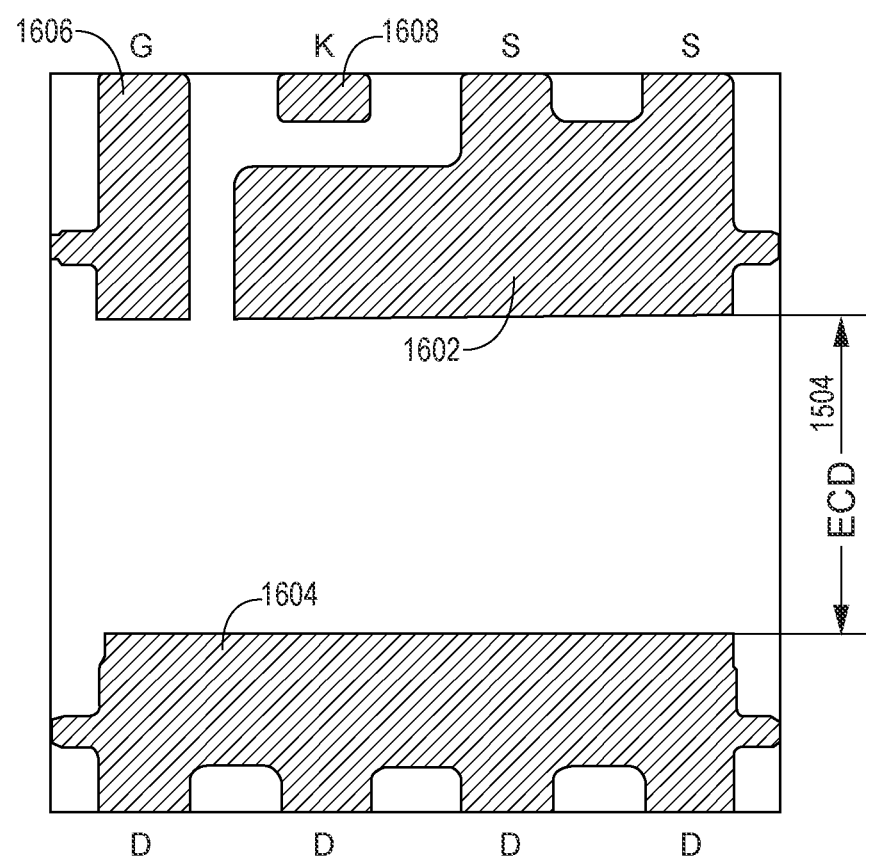
FIG. 16 is a bottom view of the example implementation of FIG. 14.

Specifically, FIG. 14 is a transparent top view of an example implementation of the package of FIG. 1, with topsetted contact portions. FIG. 15A is a first cross section, side view of the example implementation of FIG. 14. FIG. 15B is a second cross section, side view of the example implementation of FIG. 14. FIG. 15C is a third cross section, side view of the example implementation of FIG. 14. FIG. 16 is a bottom view of the example implementation of FIG. 14.

In the example of FIG. 14, a leadframe 1402 has a WBG die 1404 flip-mounted thereon. Illustrated transparently, the WBG die 1404 includes alternating source contacts 1406 and drain contacts 1408. A drain leadframe portion 1410 is on a drain side of the leadframe 1402, while a source leadframe portion 1412 is on a source side of the leadframe 1402.

As further illustrated, the source leadframe portion 1412 includes source extended portions 1414 providing leadframe source contact pads, while the drain leadframe portion 1410 includes drain extended portions 1416 providing leadframe drain contact pads. Solder overflow canals 1420, as described above, enable accurate placement and use of solder for attachment of the drain extended portions 1416 to the drain contacts 1408, and for attachment of the source extended portions 1414 to the source contacts 1406.

A gate leadframe portion 1423 includes a gate contact pad 1424 connected to a gate contact 1425 of the WBG die 1404. The leadframe 1402 further includes alignment fiducials 1428.

A clipbond heatsink 1430 is attached to provide a grounded connection to the source leadframe portion 1412, similarly to the clipbond heatsink 302 of FIG. 3. Mold material 1432 provides encapsulation of the package. Leadframe portion 1434 provides Kelvin sense terminal 1436. In another packaging configuration of similar footprint, the Kelvin sense terminal 1434 may be isolated from the Source leadframe portion 1412, but still connected to the same grounding clipbond heatsink 1430 through the same soldering process.

The source-drain cross-section at S-D of FIG. 15A illustrates that the source extended portion 1414 and the drain extended portion 1416 are topsetted, thereby forming a mold-locking cavity 1502. As illustrated, topsetting refers to a raising of a surface of the source extended portion 1414 and the drain extended portion 1416 relative to the leadframe source portion 1412 and the leadframe drain portion 1410, respectively. The Kelvin-Drain cross-section at K-D of FIG. 15B illustrates the mold-locking cavity 1502 further.

FIGS. 14 (using dotted lines), 15A, and 15B further illustrate a bottom half-etched portion(s) 1602 (source), 1604 (drain), 1606 (gate), and 1608 (Kelvin), which provide a package footprint, as shown in FIG. 16. External creepage distance 1504 is visible in FIGS. 15A and 16.

The topsetted implementation of FIGS. 14-16 may be used when an external creepage distance is larger than a die width of a WBG die to be packaged, thereby accommodating smaller die sizes. Conversely, example implementations of FIGS. 2-13 may be used for a WBG die that is larger than the external creepage distance, thereby accommodating larger die sizes.

Figure 17:
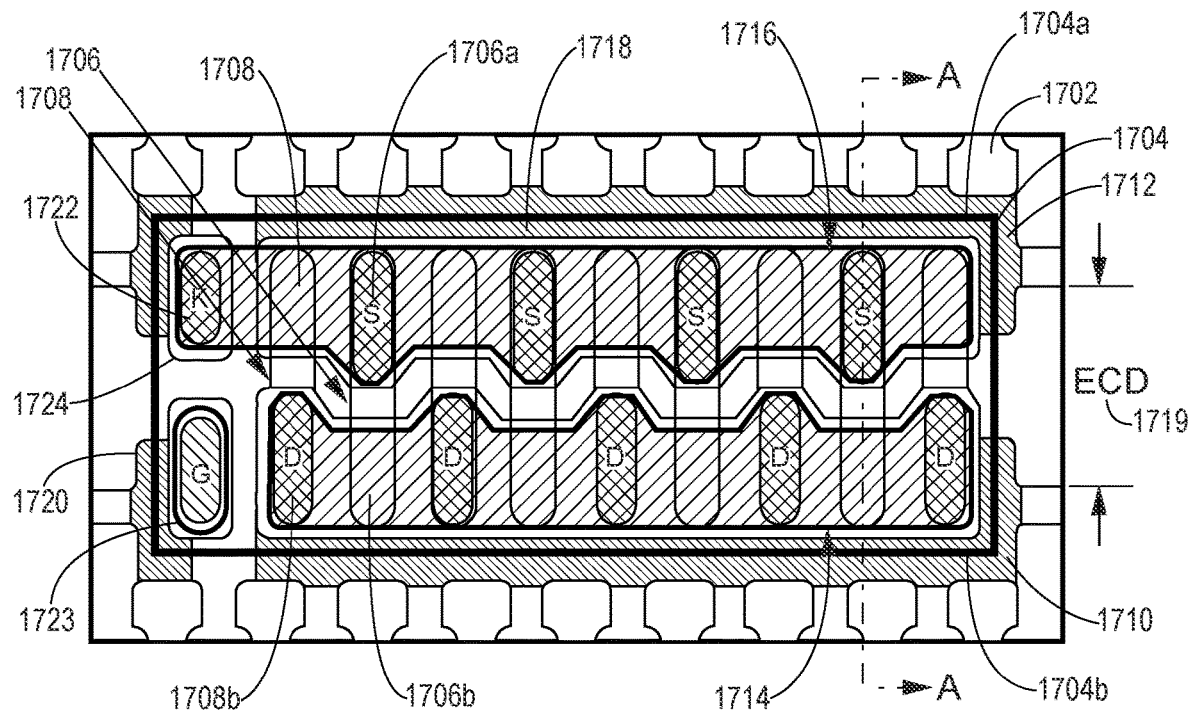
FIG. 17 is a transparent top view of an example implementation of the package of FIG. 1, using a redistribution layer.
Figure 18:
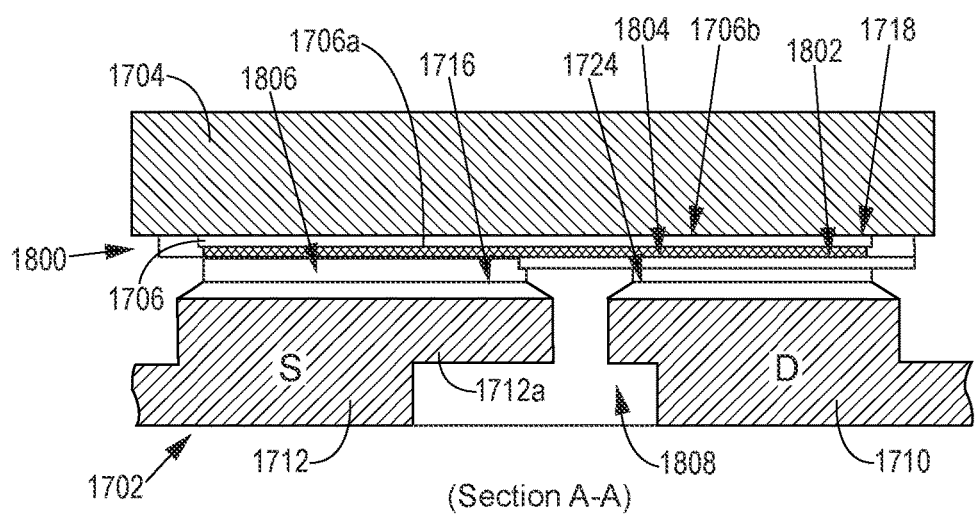
FIG. 18 is a cross section, side view of the example implementation of FIG. 17.
Figure 19:
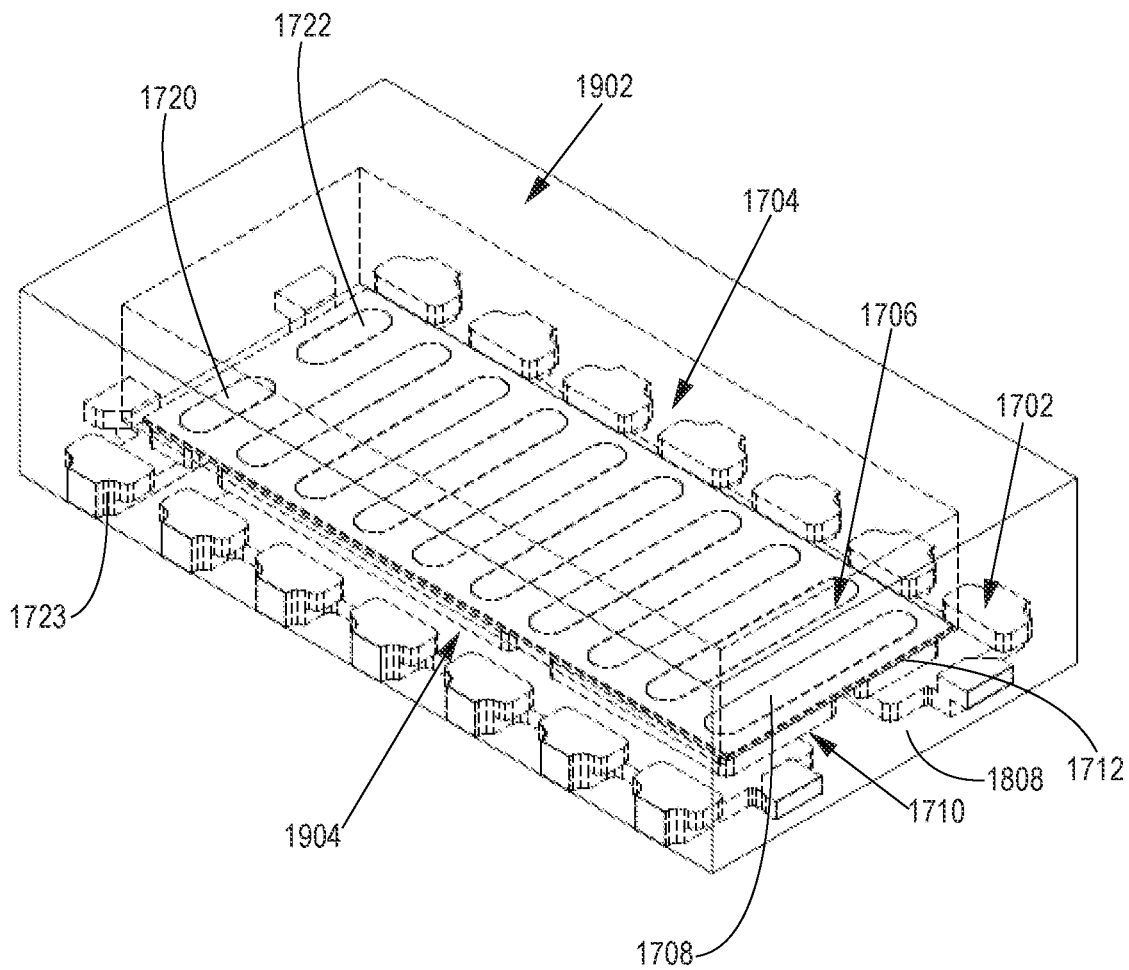
FIG. 19 is a three-dimensional top view of the example implementation of FIG. 17.
Figure 20:
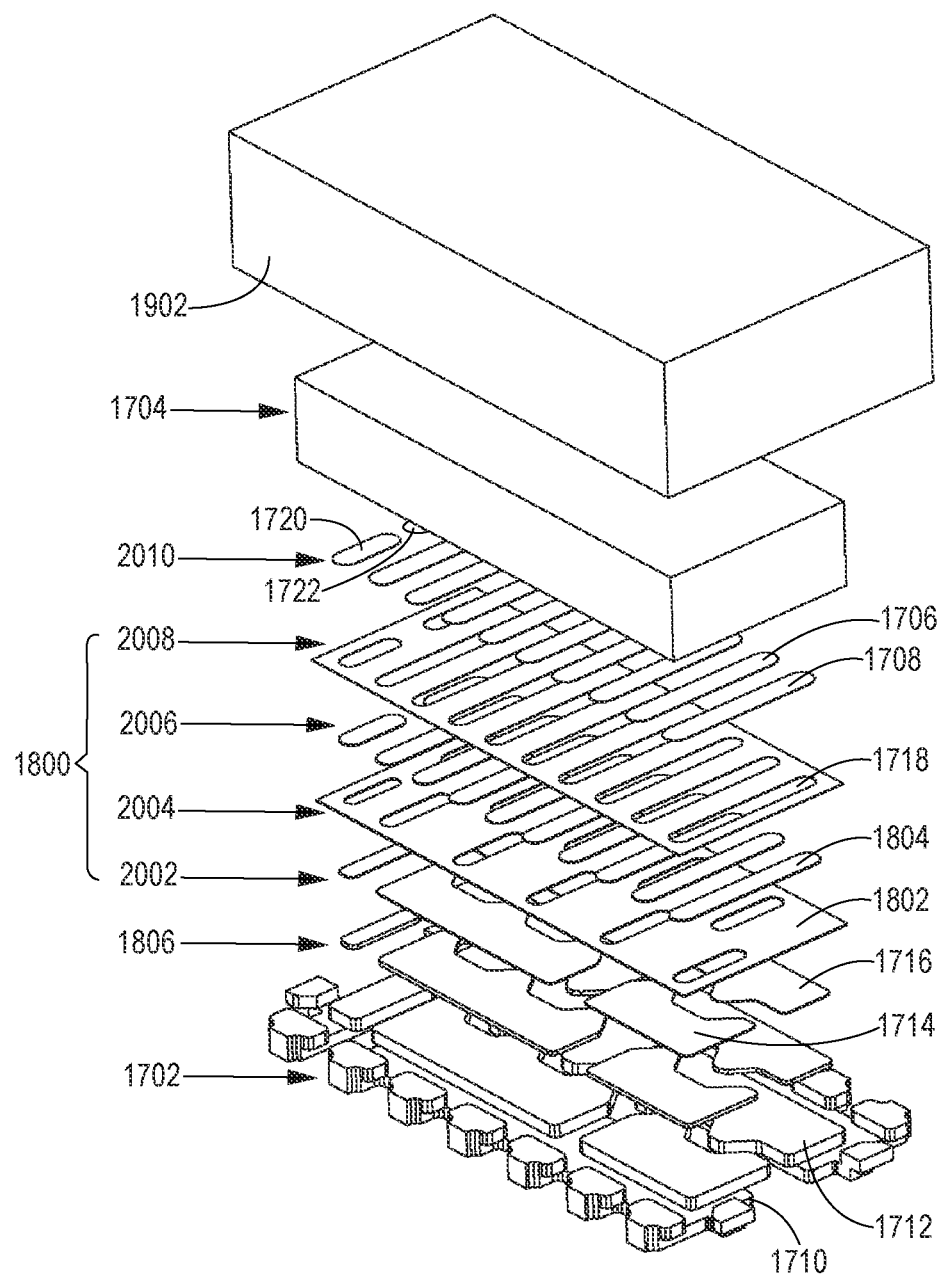
FIG. 20 is an exploded view of the example implementation of FIG. 17.

FIG. 17 is a transparent top view of an example implementation of the package of FIG. 1, using a redistribution layer (RDL), e.g., a copper RDL. FIG. 18 is a cross section, side view of the example implementation of FIG. 17. FIG. 19 is a three-dimensional top view of the example implementation of FIG. 17. FIG. 20 is an exploded view of the example implementation of FIG. 17.

As shown and described below, some instances of the WBG die 104 of FIG. 1 may have alternating source contacts 106 and drain contacts 108 that are too closely-spaced to effectively solder corresponding alternating extended portions of a contact pad thereto. Further, a large die-to-package ratio may prevent sculpting of half-etched canals. Additionally, for devices with low to medium voltage rating, an external creepage distance need not be wide.

In these and similar implementations, for example, two portions of a copper RDL may be attached to the WBG die 104, with a first, source portion connected to all the source contacts on one side of the WBG die 104 to create a combined source contact, and a second, drain portion connected to all the drain contacts on a second side of the WBG die 104 to create a combined drain contact. As further shown and described, the RDL implementations ensure that the source portion of the RDL does not electrically contact any of the drain contacts on the first side of the WBG die 104, while the drain portion of the RDL does not electrically contact any of the source contacts on the second side of the WBG die 104. Put another way, the RDL connects a portion of each alternating one of a first set of (e.g., source) contacts to a first (e.g., source) leadframe portion, and a portion of each alternating one of the second set of (e.g., drain) contacts to the second (e.g., drain) leadframe portion. Thus, such RDL implementations enable electrical conduction of the WBG die 104, even if a solderable top metal (STM) pad does not fully cover a die top metallization layer, as illustrated and described, below.

In the example of FIG. 17, a leadframe 1702 has a WBG die 1704 flip-mounted thereon. Illustrated transparently, the WBG 1704 includes alternating source contacts 1706 and drain contacts 1708. A drain leadframe portion 1710 is on a drain side of the leadframe 1702, while a source leadframe portion 1712 is on a source side of the leadframe 1702.

In the cross-sectional view of FIG. 18, taken along A-A in FIG. 17, a RDL 1800 is shown as including four layers. A first layer (2002 in FIG. 20) includes a drain portion 1714 and a source portion 1716. A second layer (2004 in FIG. 20) includes a polyimide (PI) layer 1802, not visible in FIG. 17. A third layer (2006 in FIG. 20) includes copper layer 1804, not visible in FIG. 17. A fourth layer (2008 in FIG. 20) includes a PI layer 1718.

A drain portion 1714 of the first layer of the RDL 1800 is disposed on the drain leadframe portion 1710, while a source portion 1716 of the first layer of the RDL 1800 is disposed on the source leadframe portion 1712. The drain portion 1714 and the source portion 1716 may be soldered to the drain leadframe portion 1710 and the source leadframe portion 1712, respectively, using a solder layer 1806.

As shown in FIGS. 17 and 18, the RDL 1800 enables electrical contact between the source portion 1716 of the first layer of the RDL 1800 and the source contacts 1706, along a portion 1706a of the source contacts 1706 that are thus electrically connected to define a first side 1704a of the WBG die 1704 as a source side. At the same time, the PI layers 1802, 1718 block electrical contact between the drain portion 1714 of the first layer of the RDL 1800 and the source contacts 1706, along a portion 1706b of the source contacts 1706 on a second side 1704b of the WBG die 1704 that is thus defined as a drain side. Conversely, then, the RDL 1800 enables electrical contact between the drain portion 1714 of the first layer of the RDL 1800 and the drain contacts 1708, along a portion 1708b of the drain contacts 1708 that are thus electrically connected to define the second side 1704b of the WBG die 1704 as the drain side. At the same time, the PI layers 1802, 1718 block electrical contact between the source portion 1714 of the first layer of the RDL 1800 and the drain contacts 1708, along a portion 1708a of the drain contacts 1708 on the first side 1704a of the WBG die 1704 that is defined as the source side.

Put another way, the PI layers 1802, 1718 provide openings through which source/drain contacts may be made, using intervening copper layer 1804, while otherwise blocking source/drain contacts. In this way, an external creepage distance ECD 1719 may be defined between the source portion 1716 of the first layer of the RDL 1800 and the drain portion 1714 of the first layer of the RDL 1800.

Further in FIG. 17, a gate contact 1720 is electrically connected to a gate portion 1723 of the leadframe 1702. A Kelvin contact 1722 of the WBG die 1704 is connected to a Kelvin terminal 1724 of the leadframe 1704. The gate and Kelvin connections are illustrated in more detail in the top view of FIG. 19 and the exploded side view of FIG. 20.

In addition, FIG. 19 illustrates that the leadframe 1702 may include the type of solder overflow half-etched canals 1904 described above, while being encapsulated in mold material 1902. The mold material 1902 fills a mold-locking cavity 1808 to provide additional stability to the package, as described herein.

Further, the exploded view of FIG. 20 illustrates an entirety of the solder layer 1806. FIG. 20 further illustrates that the source portion 1714 and the drain portion 1716 are part of the first layer 2002 of the RDL 1800, which further includes contact portions for the gate contact 1720 and Kelvin contact 1722 of the WBG die 1704. FIG. 20 also illustrates more fully a nature of openings in the PI layer 2004, which enable source and drain connections to be formed on desired sides 1704a, 1704b of the WBG die 1704.

In some cases, when a die to package ratio is large (e.g., 80-90%), it may be difficult to provide the half-etched canals 1904. In these cases, the RDL 1800 can nevertheless prevent solder shorting to the edges of the WBG die 1704. For devices with low to medium voltage ratings, the ECD 1719 may be adjusted accordingly. In the various example implementations, the RDL 1800 enables electrical conduction of the drain and source to be optimized, even when the first layer 2002 of the RDL does not fully cover the metallization layer 2010 of the WBG die 1704, as illustrated and described with respect to FIGS. 17-20.

In the implementations of FIGS. 17-20 and variations thereof, the WBG die 1704 may not have a coplanar, integrated ground contact, similar to the implementations of FIGS. 2-8. In such cases, a clipbonded heatsink may be included, similar to the clipbonded heatsink 302 of FIG. 3.

Figure 22:
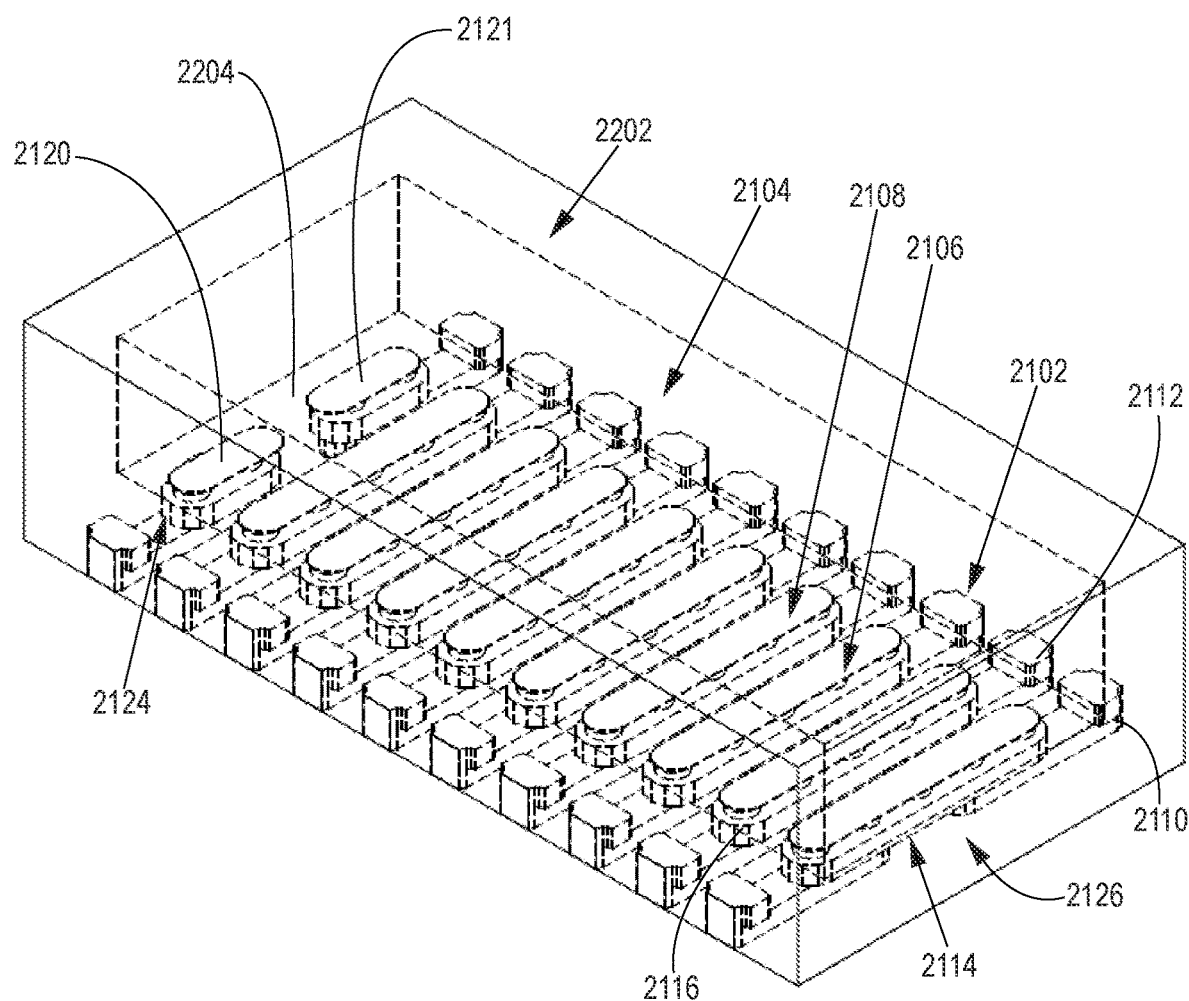
FIG. 22 is a three-dimensional top view of the example implementation of FIGS. 21A-21D.
Figure 23:
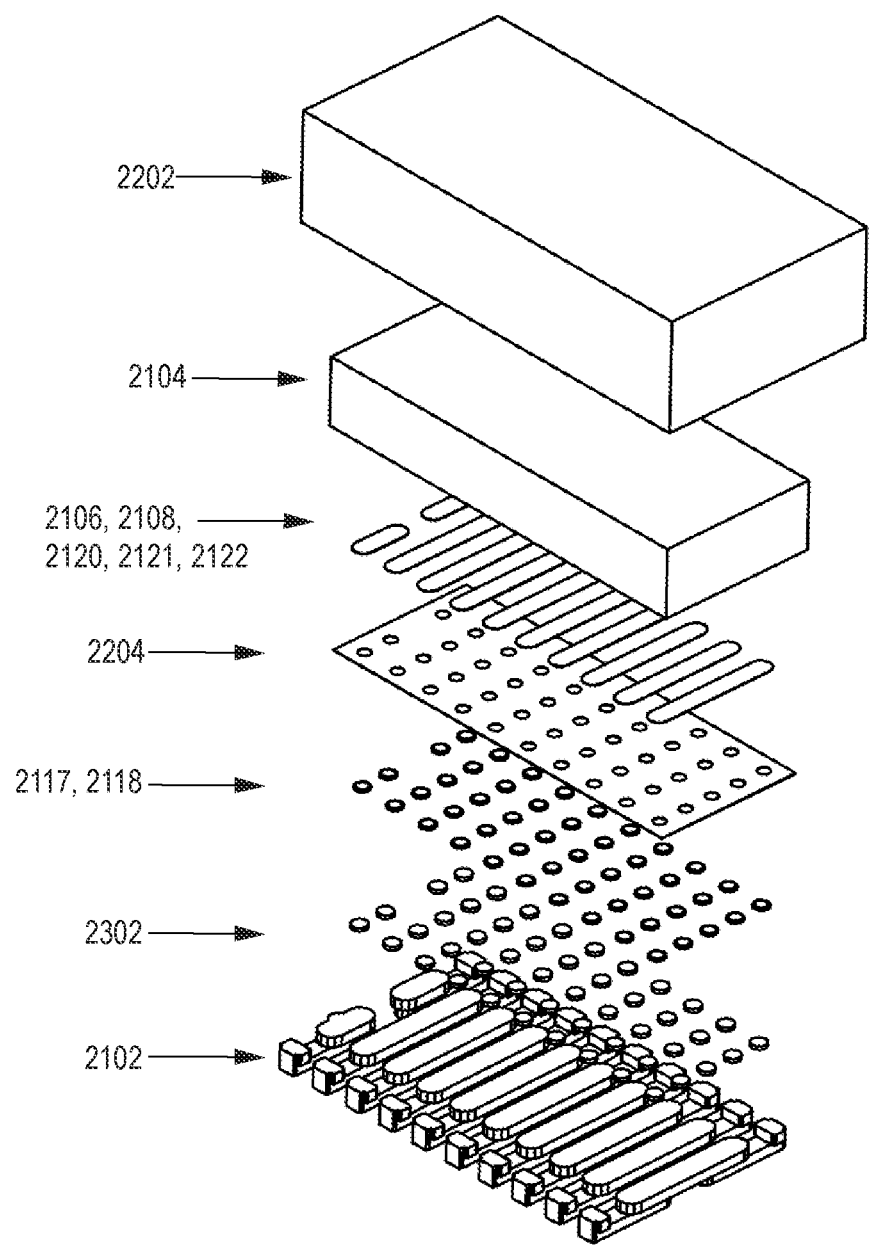
FIG. 23 is an exploded view of the example implementation of FIGS. 21A-21D.

When a coplanar, integrated ground contact is included, other implementations may be used. For example, FIGS. 21A-23 illustrate an example package layout for a WBG die that includes a co-planar ground contact and alternating drain and source terminals. Specifically, FIG. 21A is a top view of an example package layout for a WBG die that includes a co-planar ground contact and alternating drain and source terminals. FIG. 21B is a first cross section side view of the example implementation of FIG. 21A. FIG. 21C is a second cross section side view of the example implementation of FIG. 21A. FIG. 21D is a package bottom view of the example implementation of FIG. 21A. FIG. 22 is a three-dimensional top view of the example implementation of FIGS. 21A-21D. FIG. 23 is an exploded view of the example implementation of FIGS. 21A-21D.

In the example of FIG. 21A, a leadframe 2102 has a WBG die 2104 mounted thereon, which has source contacts 2106 and drain contacts 2108. The leadframe 2102 includes drain portion 2110 and source portion 2112, which, in the example, are alternating to match the source contacts 2106 and the drain contacts 2108, and which have drain contact pads 2114 and source contact pads 2116 provided thereon. A drain bump array 2117 and a source bump array 2118 refers to conductive bumps used to establish connections between the leadframe 2102 and the WBG die 2104, as illustrated and described in more detail, below. Gate 2120 and ground terminal 2122 are further illustrated.

In FIG. 21B, a cross section taken along line A-A of FIG. 21A, half etched canals 2124 provide the type of solder overflow prevention and other advantages described herein, while a mold-locking cavity 2126 provides improved package stability. In FIG. 21C, a cross section taken along line B-B of FIG. 21A illustrates an alternating nature of the leadframe drain portions 2110 and source portions 2112. FIG. 21D illustrates a package bottom view, including an ECD 2129.

Further visible in FIG. 22, mold material 2202 encapsulates the package, while a PI layer 2204 provides passivation and enables desired drain/source connections for the bump arrays 2117, 2118, as shown in more detail in FIG. 23.

Specifically, FIG. 23 illustrates that a solder bump array 2302 may be used to attach the, e.g, Cu bump array 2117, 2118 to the leadframe 2102. Accordingly, electrical connection to the source contacts 2106 and the drain contacts 2108 may be established through the PI layer 2204.

In various implementations, the CU bump array 2117, 2118 may include circular or oblong bumps. As shown, the drain and source contact pads may be matched with the bump array 2117, 2118 as one elongated pad that extends to the opposing ends of the package. Contact pad width may be maximized thru minimization of the pad to pad spacing. Package footprint can follow the alternating drain and source connections of the die, but in a slightly bigger outline than the WBG die 2104.

In a similar packaging configuration as FIGS. 21A-23, FIGS. 24A-26 illustrate a packaging configuration which may be suitable for WBG die with a relatively small contact pad pitch. As illustrated and described, the same terminal pad types (i.e., all drain and all source terminal pads) are placed on opposing sides. Further, alternating contact pads may be hidden through half-etching. Accordingly, terminal width may be maximized for relatively stronger solder joints.

Figures 24A, 24B, 24C:
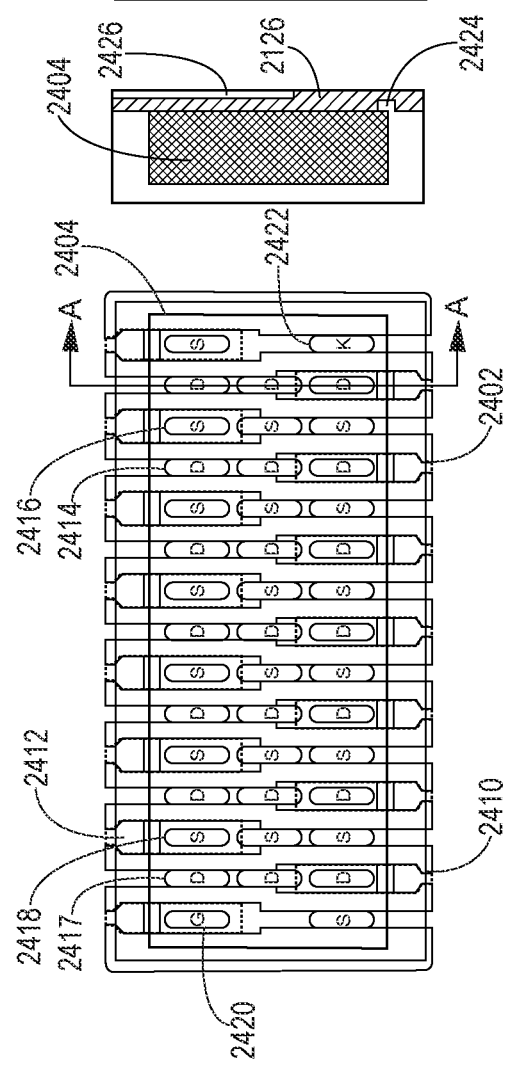
FIG. 24A is a top view of an example package layout for a WBG die that includes a co-planar ground contact with drain and source terminals on opposing sides.
FIG. 24B is a cross section side view of the example implementation of FIG. 24A.
FIG. 24C is a package bottom view of the example implementation of FIG. 24A.
Figure 25:
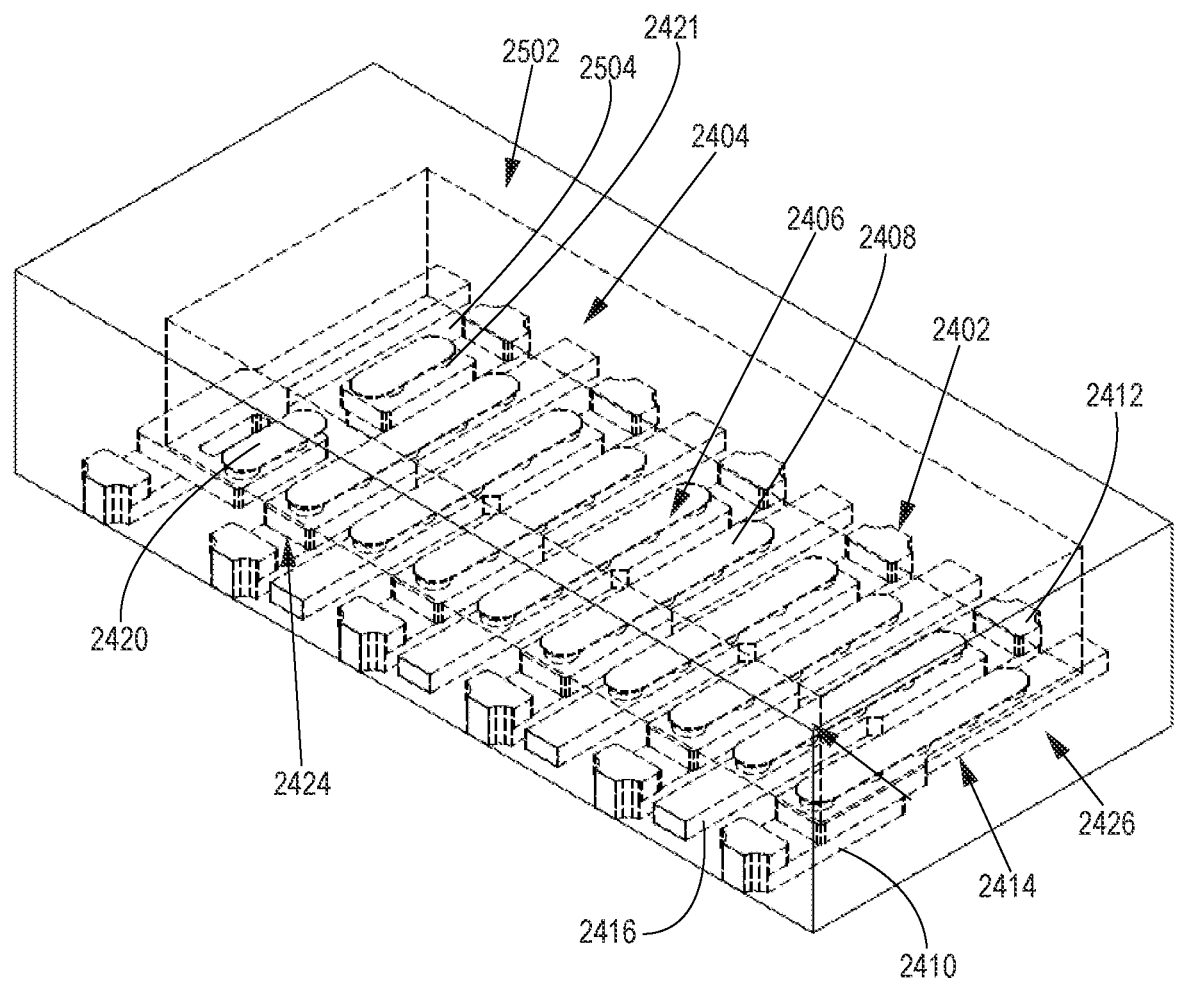
FIG. 25 is a three-dimensional top view of the example implementation of FIGS. 24A-24C.
Figure 26:
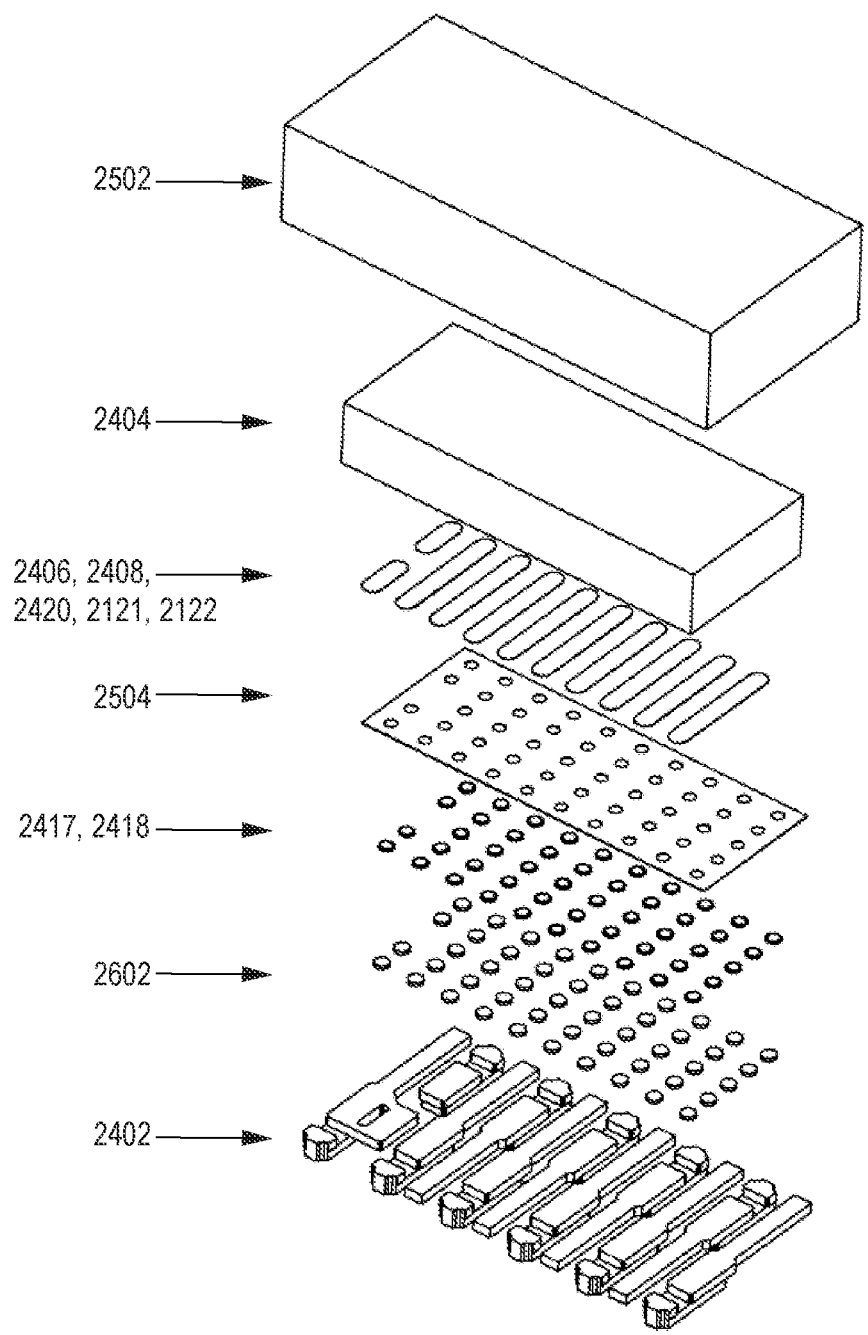
FIG. 26 is an exploded view of the example implementation of FIGS. 24A-24C.

Specifically, FIG. 24A is a top view of an example package layout for a WBG die that includes a co-planar ground contact with drain and source terminals on opposing sides. FIG. 24B is a cross section side view of the example implementation of FIG. 24A. FIG. 24C is a package bottom view of the example implementation of FIG. 24A. FIG. 25 is a three-dimensional top view of the example implementation of FIGS. 24A-24C. FIG. 26 is an exploded view of the example implementation of FIGS. 24A-24C.

In the example of FIG. 24A, a leadframe 2402 has a WBG die 2404 mounted thereon, which has source contacts 2406 and drain contacts 2408. The leadframe 2402 includes drain portion 2410 and source portion 2412, which, in the example, are alternating to match the source contacts 2406 and the drain contacts 2408, and which have drain contact pads 2414 and source contact pads 2416 provided thereon. A drain bump array 2417 and a source bump array 2418 refers to conductive bumps used to establish connections between the leadframe 2402 and the WBG die 2404, as illustrated and described in more detail, below, and similar to bump arrays 2117, 2118, above. Gate 2420 is further illustrated.

In FIG. 24B, a cross section taken along line A-A of FIG. 24A, half etched canals 2424 provide the type of solder overflow prevention and other advantages described herein, while a mold-locking cavity 2426 provides improved package stability. FIG. 24C illustrates a package bottom view, including an ECD 2429.

Further visible in FIG. 25, mold material 2502 encapsulates the package, while a PI layer 2504 provides passivation and enables desired drain/source connections for the bump arrays 2417, 2418, as shown in more detail in FIG. 26.

Specifically, FIG. 26 illustrates that a solder bump array 2602 may be used to attach the, e.g, Cu bump array 2417, 2418 to the leadframe 2402. Accordingly, electrical connection to the source contacts 2406 and the drain contacts 2408 may be established through the PI layer 2504.

In various implementations, the CU bump array 2417, 2418 may include circular or oblong bumps. As shown, the drain and source contact pads may be matched with the bump array 2417, 2418 as one elongated pad that extends to the opposing ends of the package.

Thus, described implementations provide a mold locking cavity defined by surfaces of source extended portions and drain extended portions that are opposite source contact pads and drain contact pads of source extended portions and drain extended portions of a leadframe. Accordingly, a semiconductor device package may be provided with mold material encapsulating at least a portion of the leadframe and at least a portion of a semiconductor die flip-mounted thereon, and filling the mold locking cavity including contacting the surfaces of the source extended portions and the drain extended portions thereof.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package, comprising:
a leadframe, the leadframe having a first portion with first extended portions and a second portion with second extended portions, the first portion being entirely physically disconnected from the second portion, the first extended portions being interdigitated with the second extended portions along an axis, wherein the first portion includes a first recessed portion with the first extended portions connected thereto, the first recessed portion having a top surface that is recessed below a first surface of the first extended portions, the first recessed portion extending at least partially around three sides of each of the first extended portions, and the second portion includes a second recessed portion with the second extended portions connected thereto, the second recessed portion having a top surface that is recessed below a first surface of the second extended portions, the second recessed portion extending at least partially around three sides of each of the second extended portions, wherein each of the first extended portions is spaced from the second recessed portion in a direction perpendicular to the axis, and each of the second extended portions is spaced from the first recessed portion in the direction perpendicular to the axis;
mold material encapsulating at least a portion of the leadframe and at least a portion of a semiconductor die electrically mounted to the leadframe, the semiconductor die having a first set of contacts alternated with a second set of contacts, with the first set of contacts connected to the first surface of the first extended portions and the second set of contacts connected to the first surface of the second extended portions; and
a mold-locking cavity having the mold material included therein and in contact with a second surface of the first extended portions opposed to the first surface of the first extended portions, a second surface of the second extended portions opposed to the first surface of the second extended portions, the first portion of the leadframe, and the second portion of the leadframe.

2. The semiconductor device package of claim 1, wherein the semiconductor die is a wide band gap (WBG) semiconductor die.

3. The semiconductor device package of claim 1, wherein the first extended portions are source extended portions and the first set of contacts are source contacts, and further wherein the second extended portions are drain extended portions and the second set of contacts are drain contacts.

4. The semiconductor device package of claim 1, wherein the first extended portions extend past the second extended portions in the direction perpendicular to the axis.

5. The semiconductor device package of claim 1, further comprising a clipbond heatsink mounted on a surface of the semiconductor die opposite a surface of the first set of contacts and the second set of contacts, and electrically connected to the first leadframe portion.

6. The semiconductor device package of claim 1, wherein the semiconductor die includes a ground connection on a first surface thereof having the first set of contacts and the second set of contacts, and further wherein the semiconductor device package includes a heatsink mounted on a second surface of the semiconductor die opposite the first surface.

7. The semiconductor device package of claim 1, wherein the first recessed portion and the second recessed portion form solder overflow canals.

8. The semiconductor device package of claim 1, further comprising a redistribution layer (RDL) connecting a portion of each alternating one of the first set of contacts to the first leadframe portion, and connecting a portion of each alternating one of the second set of contacts to the second leadframe portion.

9. A semiconductor device package, comprising:
a leadframe having a source portion and a drain portion, the source portion having source extended portions having source contact pads on a first surface of the source extended portions, and the drain portion having drain extended portions interdigitated with the source extended portions along an axis and having drain contact pads on a first surface of the drain extended portions, wherein the source portion includes a source recessed portion with the source extended portions connected thereto, the source recessed portion having a top surface that is recessed below the first surface of the source extended portions, the source recessed portion extending at least partially around three sides of each of the source extended portions, and the drain portion includes a drain recessed portion with the drain extended portions connected thereto, the drain recessed portion having a top surface that is recessed below the first surface of the drain extended portions, the drain recessed portion extending at least partially around three sides of each of the drain extended portions, wherein each of the source extended portions is spaced from the drain recessed portion in a direction perpendicular to the axis and has a first source extended portion end face and a second source extended portion end face opposite one another along the direction perpendicular to the axis, and each of the drain extended portions is spaced from the source recessed portion in the direction perpendicular to the axis and has a first drain extended portion end face and a second drain extended portion end face opposite one another along the direction perpendicular to the axis;
a semiconductor die having alternating source contacts and drain contacts provided thereon, the source contacts being connected to the source contact pads and the drain contacts being connected to the drain contact pads;
a mold locking cavity defined by second surfaces of the source extended portions and the drain extended portions that are opposite the source contact pads and the drain contact pads; and
mold material encapsulating at least a portion of the leadframe and at least a portion of the semiconductor die, and filling the mold locking cavity including contacting the second surfaces of the source extended portions and the drain extended portions.

10. The semiconductor device package of claim 9, wherein the semiconductor die is a wide band gap (WBG) semiconductor die.

11. The semiconductor device package of claim 9, wherein the source extended portions are interdigitated with the drain extended portions.

12. The semiconductor device package of claim 9, wherein the source contacts and the drain contacts are coplanar with one another, and with a gate contact.

13. The semiconductor device package of claim 9, further comprising a redistribution layer (RDL) connecting a portion of each alternating one of the source contacts to the source leadframe portion, and connecting a portion of each alternating one of the drain contacts to the drain leadframe portion.

\* \* \* \* \*